US012685049B2

(12) United States Patent
Kubouchi et al.

(10) Patent No.: US 12,685,049 B2
(45) Date of Patent: Jul. 14, 2026

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Motoyoshi Kubouchi, Matsumoto-city (JP); Takashi Yoshimura, Matsumoto-city (JP); Hiroshi Takishita, Matsumoto-city (JP); Misaki Uchida, Matsumoto-city (JP); Michio Nemoto, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 444 days.

(21) Appl. No.: 17/703,928

(22) Filed: Mar. 24, 2022

(65) Prior Publication Data

US 2022/0216055 A1 Jul. 7, 2022

Related U.S. Application Data

(63) Continuation of application No. PCT/JP2021/014179, filed on Apr. 1, 2021.

(30) Foreign Application Priority Data

Apr. 1, 2020 (JP) ................................. 2020-066314

(51) Int. Cl.
 H01L 21/22 (2006.01)
 H10D 8/00 (2025.01)
 (Continued)

(52) U.S. Cl.
 CPC ............. H10P 32/18 (2026.01); H10D 8/422 (2025.01); H10D 12/481 (2025.01); (Continued)

(58) Field of Classification Search
 CPC ............. H01L 29/7813; H01L 29/7802; H01L 29/7395; H01L 29/7396; H01L 29/7397;
 (Continued)

(56) References Cited

U.S. PATENT DOCUMENTS

2008/0315364 A1 12/2008 Nemoto
2012/0267681 A1 10/2012 Nemoto
 (Continued)

FOREIGN PATENT DOCUMENTS

CN 107408581 A 11/2017
DE 112010004241 T5 5/2013
 (Continued)

OTHER PUBLICATIONS

Office Action issued for counterpart Japanese Application No. 2022-511136, issued by the Japanese Patent Office on Apr. 18, 2023 (drafted on Apr. 13, 2023).
 (Continued)

*Primary Examiner* — Jessica S Manno
*Assistant Examiner* — Victor J Lasasso

(57) ABSTRACT

Provided is a semiconductor device including: a semiconductor substrate having an upper surface and a lower surface, and containing a bulk donor; a buffer region of a first conductivity type which is disposed on the lower surface side of the semiconductor substrate and contains a hydrogen donor, and in which a doping concentration distribution in a depth direction of the semiconductor substrate has a single first doping concentration peak; a high-concentration region of a first conductivity type which is disposed between the buffer region and the upper surface of the semiconductor substrate, contains a hydrogen donor, and has a donor concentration higher than a bulk donor concentration; and a lower surface region of a first conductivity type or a second conductivity type which is disposed between the buffer (Continued)

region and a lower surface of the semiconductor substrate, and has a doping concentration higher than the high-concentration region.

17 Claims, 27 Drawing Sheets

(51) Int. Cl.

| | | |
|---|---|---|
| *H10D 12/00* | (2025.01) | |
| *H10D 62/17* | (2025.01) | |
| *H10D 62/53* | (2025.01) | |
| *H10D 84/60* | (2025.01) | |
| *H10P 30/20* | (2026.01) | |
| *H10P 32/10* | (2026.01) | |
| *H10P 52/00* | (2026.01) | |
| *H01L 21/265* | (2006.01) | |
| *H01L 21/304* | (2006.01) | |

(52) U.S. Cl.
CPC ........... *H10D 62/393* (2025.01); *H10D 62/53* (2025.01); *H10D 84/617* (2025.01); *H10P 30/204* (2026.01); *H10P 30/214* (2026.01); *H10P 32/171* (2026.01); *H10P 52/00* (2026.01)

(58) Field of Classification Search
CPC ......... H01L 29/66712; H01L 29/66333; H01L 29/66348; H01L 29/1095; H01L 29/0834; H01L 29/0696; H01L 29/407; H01L 29/36; H01L 29/32; H01L 21/2252; H01L 21/04; H01L 21/263; H01L 21/2253; H01L 21/26506; H01L 21/324; H01L 21/265; H01L 21/221; H01L 21/322; H01L 21/26513; H01L 21/3225; H01L 2224/0603; H10D 62/60; H10D 12/00; H10D 30/0291; H10D 8/60; H10D 12/038; H10D 12/441; H10D 30/0297; H10D 30/66; H10D 12/481; H10D 30/655; H10D 62/393; H10D 62/142; H10D 62/53; H10D 64/117; H10D 62/127; H10D 8/422; H10D 62/106; H10D 8/00; H10D 62/129; H10D 84/811; H10D 30/60; H10D 64/519
See application file for complete search history.

(56) References Cited

U.S. PATENT DOCUMENTS

| | | | |
|---|---|---|---|
| 2013/0249058 A1 | 9/2013 | Neidhart | |
| 2014/0299915 A1 | 10/2014 | Kouno | |
| 2015/0050754 A1 | 2/2015 | Ploss | |
| 2015/0214347 A1 | 7/2015 | Falck | |
| 2015/0270132 A1 | 9/2015 | Laven | |
| 2015/0357229 A1 | 12/2015 | Schulze | |
| 2015/0371858 A1* | 12/2015 | Laven ...................... | H10D 8/60 |
| | | | 438/530 |
| 2016/0141399 A1 | 5/2016 | Jelinek | |
| 2016/0172438 A1 | 6/2016 | Jelinek | |
| 2017/0222029 A1 | 8/2017 | Kono | |
| 2017/0243940 A1* | 8/2017 | Schmidt ............... | H01L 21/266 |
| 2017/0271447 A1* | 9/2017 | Tamura .................. | H10D 62/60 |
| 2018/0005829 A1 | 1/2018 | Takishita | |
| 2018/0005831 A1 | 1/2018 | Schulze | |
| 2018/0012762 A1 | 1/2018 | Mukai | |
| 2020/0194562 A1 | 6/2020 | Yoshimura | |
| 2020/0357903 A1 | 11/2020 | Kubouchi | |
| 2021/0082702 A1 | 3/2021 | Agata | |
| 2021/0104407 A1 | 4/2021 | Meguro | |

FOREIGN PATENT DOCUMENTS

| | | | |
|---|---|---|---|
| DE | 112019001123 T5 | 11/2020 | |
| DE | 112019002290 T5 | 4/2021 | |
| JP | 2013138172 A | 7/2013 | |
| WO | 2007055352 A1 | 5/2007 | |
| WO | 2017047276 A1 | 3/2017 | |
| WO | 2017047285 A1 | 3/2017 | |
| WO | 2019181852 A1 | 9/2019 | |
| WO | 2020036015 A1 | 2/2020 | |
| WO | 2020080295 A1 | 4/2020 | |
| WO | 2020138218 A1 | 7/2020 | |

OTHER PUBLICATIONS

International Search Report and (ISA/237) Written Opinion of the International Search Authority for International Patent Application No. PCT/JP2021/014179, issued/mailed by the Japan Patent Office on Jul. 6, 2021.
Office Action issued for counterpart Chinese Application 202180005478. 1, issued by The State Intellectual Property Office of People's Republic of China on Nov. 24, 2025.
Office Action for counterpart German Application No. 112021000165. 5, issued by the German Patent and Trademark Office on Apr. 23, 2026.

* cited by examiner

SEMICONDUCTOR DEVICE AND MANUFACTURING METHOD OF SEMICONDUCTOR DEVICE

The contents of the following Japanese patent applications are incorporated herein by reference:

NO. 2020-066314 filed in JP on Apr. 1, 2020, and
PCT/JP2021/014179 filed in WO on Apr. 1, 2021.

BACKGROUND

1. Technical Field

The present invention relates to a semiconductor device and a manufacturing method of the semiconductor device.

2. Related Art

Conventionally, a technique of implanting hydrogen ions into a semiconductor wafer to adjust the doping concentration of the semiconductor wafer has been known (see, for example, Patent Document 1). Patent Document 1: US No. 2015/0050754

DESCRIPTION OF EXEMPLARY EMBODIMENTS

Figure 1:
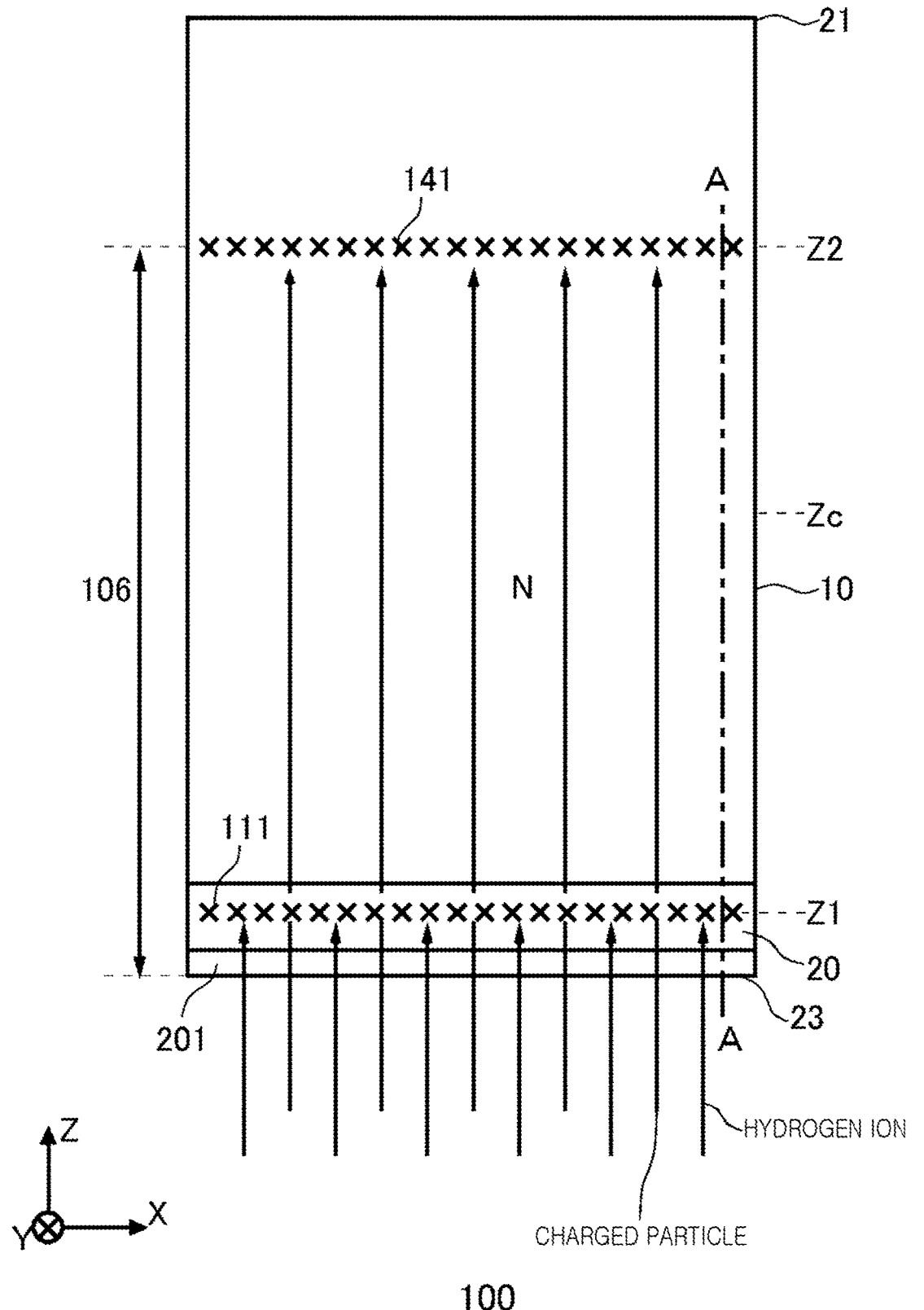
FIG. 1 is a sectional view illustrating an example of a semiconductor device 100.

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. The Z axis direction described without positive or negative sign means a direction parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side. In the present specification, the center position in the depth direction of the semiconductor substrate may be referred to as Zc.

In the present specification, a case where a term such as "same" or "equal" is mentioned may include a case where an error due to a variation in manufacturing or the like is included. The error is, for example, within 10%.

In the present specification, a conductivity type of a doping region in which doping has been carried out with an impurity is described as a P type or an N type. In the present specification, the impurity may particularly mean either a donor of the N type or an acceptor of the P type, and may be described as a dopant. In the present specification, the doping means introducing the donor or the acceptor into the semiconductor substrate and turning it into a semiconductor exhibiting a conductivity type of the N type, or a semiconductor exhibiting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, if the donor concentration is $N_D$ and the acceptor concentration is $N_A$, the net doping concentration at an arbitrary position is $N_D$-$N_A$. In the present specification, the net doping concentration may be simply referred to as a doping concentration.

The donor has a function of supplying electrons to a semiconductor. The acceptor has a function of receiving electrons from the semiconductor. The donor and acceptor are not limited to the impurities themselves. For example, a VOH defect in which vacancies (V), oxygen (O), and hydrogen (H) are attached in a semiconductor functions as a donor for supplying electrons. In the present specification, the VOH defect may be referred to herein as a hydrogen donor.

A P+ type or an N+ type described herein means a doping concentration higher than that of the P type or the N type, and a P− type or an N− type described herein means a doping concentration lower than that of the P type or the N type. In addition, a P++ type or an N++ type described herein means a doping concentration higher than that of the P+ type or the N+ type. The unit system described herein is an SI unit system unless otherwise specified. The unit of length may be expressed in cm, but various calculations may be performed after conversion into meters (m).

A chemical concentration described herein indicates an atomic density of an impurity measured regardless of an electrical activation state. The chemical concentration (atomic density) can be measured by, for example, secondary ion mass spectrometry (SIMS). The net doping concentration described above can be measured by capacitance-voltage profiling (CV profiling). In addition, a carrier concentration measured by spreading resistance profiling method (SRP method) may be set as the net doping concentration. The carrier concentration measured by the CV profiling or the SRP method may be a value in a thermal equilibrium state. In addition, in a region of the N type, the donor concentration is sufficiently higher than the acceptor concentration, and thus the carrier concentration in the region may be set as the donor concentration. Similarly, in a region of the P type, the carrier concentration in the region may be set as the acceptor concentration. In the present specification, the doping concentration of the N type region may be referred to as a donor concentration, and the doping concentration of the P type region may be referred to as an acceptor concentration.

In addition, when a concentration distribution of the donor, acceptor, or net doping has a peak in a region, a value of the peak may be set as the concentration of the donor, acceptor, or net doping in the region. When the concentration of the donor, acceptor or net doping is substantially uniform in a region, or the like, an average value of the concentration of the donor, acceptor or net doping in the region may be set as the concentration of the donor, acceptor or net doping. In the present specification, atoms/cm³ or/cm³ may be used for concentration display per unit volume. This unit is used for the donor or acceptor concentration or the chemical concentration in the semiconductor substrate. The expression of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder of a crystal structure caused by a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of chemical concentrations of these. On the other hand, the donor concentration of hydrogen as a donor in the silicon semiconductor is about 0.1% to 10% of the chemical concentration of hydrogen. Each concentration described herein may be a value at room temperature. As the value at room temperature, a value at 300 K (Kelvin) (about 26.9° C.) may be used as an example.

When charged particles such as ions or electrons are implanted into a semiconductor substrate with a predetermined acceleration energy, these particles have a predetermined distribution in the depth direction. In the present specification, the peak position of the distribution may be referred to as the position where the particles are implanted, the depth at which the particles are implanted, or the like.

FIG. 1 is a sectional view illustrating an example of a semiconductor device 100. The semiconductor device 100 includes a semiconductor substrate 10. The semiconductor substrate 10 is a substrate formed of a semiconductor material. As an example, the semiconductor substrate 10 is a silicon substrate.

At least one of a transistor device such as an insulated gate bipolar transistor (IGBT) and a diode device such as a freewheeling diode (FWD) is formed on the semiconductor substrate 10. In FIG. 1, the respective electrodes of the transistor device and the diode device, and the respective regions provided in the semiconductor substrate 10 are omitted. Configuration examples of the transistor device and the diode device will be described later.

In the semiconductor substrate 10 of the present example, bulk donors of an N type are distributed throughout. The bulk donor is a dopant donor substantially uniformly contained in an ingot during the production of the ingot from which the semiconductor substrate 10 is made. The bulk donor of the present example is an element other than hydrogen. The dopant of the bulk donor is, for example, phosphorus, antimony, arsenic, selenium, or sulfur, but the invention is not limited to these. The bulk donor of the present example is phosphorus. The bulk donor is also contained in the P type region. The semiconductor substrate 10 may be a wafer cut out from a semiconductor ingot, or may be a chip obtained by dicing the wafer into individual pieces. The semiconductor ingot may be manufactured by either a Czochralski method (CZ method), a magnetic field applied Czochralski method (MCZ method), or a float zone method (FZ method). The ingot in the present example is manufactured by the MCZ method. The oxygen concentration contained in the substrate manufactured by the MCZ method is $1\times10^{17}$ to $7\times10^{17}/\text{cm}^3$. The oxygen concentration contained in the substrate manufactured by the FZ method is $1\times10^{15}$ to $5\times10^{16}/\text{cm}^3$. When the oxygen concentration is high, hydrogen donors tend to be easily generated. As the bulk donor concentration, the chemical concentration of the bulk donor distributed throughout the semiconductor substrate 10 may be used, or a value between 90% to 100% of the chemical concentration may be used. As the semiconductor substrate 10, a non-doped substrate not containing a dopant such as phosphorus may be used. In that case, the bulk donor concentration of the non-doped substrate is, for example, from $1\times10^{10}/\text{cm}^3$ to $5\times10^{12}/\text{cm}^3$. The bulk donor concentration of the non-doped substrate is preferably $1\times10^{11}/\text{cm}^3$ or more. The bulk donor concentration of the non-doped substrate is preferably $5\times10^{12}/\text{cm}^3$ or less.

The semiconductor substrate 10 has an upper surface 21 and a lower surface 23. The upper surface 21 and the lower surface 23 are two principal surfaces of the semiconductor substrate 10. In the present specification, orthogonal axes in a plane parallel to the upper surface 21 and the lower surface 23 are defined as an X axis and a Y axis, and an axis perpendicular to the upper surface 21 and the lower surface 23 is defined as a Z axis.

Charged particles are implanted from the lower surface 23 into a second depth position Z2 in the semiconductor substrate 10. The charged particles are, for example, hydrogen ions, helium ions, or electrons. The semiconductor substrate 10 of the present example has an impurity chemical concentration peak 141 such as hydrogen or helium at the second depth position Z2. Note that the second depth position Z2 may be a position above the upper surface 21. That is, the charged particles may be implanted so as to penetrate the semiconductor substrate 10.

The depth position is a position in the depth direction (Z axis direction) of the semiconductor substrate 10. In the present specification, the distance from the lower surface 23 to each position may be referred to as the depth position of each position. For example, the second depth position Z2 indicates that the distance from the lower surface 23 is Z2. The second depth position Z2 may be disposed on the upper surface 21 side of the semiconductor substrate 10 (that is, the region between the upper surface 21 and a central position Zc in the depth direction).

An average distance (also referred to as a range) over which the charged particles pass through the inside of the semiconductor substrate 10 can be controlled by acceleration energy for accelerating the charged particles. In the present example, the acceleration energy is set so that the average range of the charged particles is the distance Z2. The average range Z2 of the charged particles may be larger than half the thickness of the semiconductor substrate 10 in the depth direction.

In the present specification, a region through which the implanted charged particles have passed may be referred to as a passed-through region 106. In the example of FIG. 1, a region from the lower surface 23 of the semiconductor substrate 10 to the second depth position Z2 is the passed-through region 106. In the example of FIG. 1, the charged particles are implanted from the entire lower surface 23 of the semiconductor substrate 10. In another example, the charged particles may be implanted into only a partial region of the lower surface 23. As a result, the passed-through region 106 can be locally formed in the XY plane.

A buffer region 20 of an N type is provided on the lower surface 23 side of the semiconductor substrate 10 (that is, the region between the lower surface 23 and the central position Zc in the depth direction). A lower surface region 201 is provided between the buffer region 20 and a lower surface 23. The lower surface region 201 is an N type or P type region having a doping concentration higher than a high-concentration region 150 described later. The lower surface region 201 may be a cathode region or a collector region described later. The buffer region 20 suppresses a depletion layer spreading from the upper surface 21 side of the semiconductor substrate 10 from reaching the lower surface region 201 (punch-through).

In the buffer region 20, the doping concentration distribution of the semiconductor substrate 10 in the depth direction has a single first doping concentration peak 111. The first doping concentration peak 111 is disposed at a first depth position Z1

Providing the first doping concentration peak 111 can prevent the above-mentioned depletion layer from spreading to the lower surface 23 side exceeding the first doping concentration peak 111. The buffer region 20 may contain a hydrogen donor.

In the present example, hydrogen ions such as protons are implanted into the first depth position Z1 from the lower surface 23. In the present example, the impurity ions are locally not implanted other than the above-mentioned hydrogen ions and charged particles between the first depth position Z1 and the second depth position Z2.

In the passed-through region 106 through which the charged particles have passed in the semiconductor substrate 10, lattice defects mainly including vacancies such as monovacancies (V) and divacancies (VV) are formed by the charged particles passing therethrough. Atoms adjacent to the vacancies have dangling bonds. Lattice defects include interstitial atoms, dislocations, and the like, and may contain donors and acceptors in a broad sense. However, in the present specification, lattice defects mainly having vacancies may be referred to as vacancy-type lattice defects, vacancy-type defects, or simply lattice defects. In addition, since many lattice defects are formed by injection of charged particles into the semiconductor substrate 10, the crystallinity of the semiconductor substrate 10 may be strongly disturbed. In the present specification, this disturbance of crystallinity may be referred to as disorder.

In addition, oxygen is contained in the entire semiconductor substrate 10. The oxygen is introduced intentionally or unintentionally at the time of manufacturing a semiconductor ingot. In the semiconductor substrate 10, a hydrogen (H), a vacancy (V), and an oxygen (O) are attached to form a VOH defect. The heat treatment of the semiconductor substrate 10 makes hydrogen, which has been implanted into the first depth position Z1, diffuse to promote the formation of VOH defects. When the charged particles implanted into the second depth position Z2 are hydrogen ions, hydrogen also diffuses from the second depth position Z2, and further promotes the formation of VOH defects.

The VOH defect functions as a donor that supplies electrons. In the present specification, VOH defects may be referred to simply as hydrogen donors. In the present example, a hydrogen donor is formed in the passed-through region 106 of the charged particles. The doping concentration of the hydrogen donor is lower than the chemical concentration of hydrogen. When the ratio of the doping concentration of the hydrogen donor to the chemical concentration of hydrogen is defined as an activation rate, the activation rate may be a value of 0.1% to 30%. In the present example, the activation rate is 1% to 5%.

By forming a hydrogen donor in the passed-through region 106 of the semiconductor substrate 10, the donor concentration in the passed-through region 106 can be made higher than the bulk donor concentration. Usually, it is necessary to prepare the semiconductor substrate 10 having a predetermined bulk donor concentration in accordance with characteristics of an element to be formed in the semiconductor substrate 10, particularly a rated voltage or a breakdown voltage. On the other hand, according to the semiconductor device 100 illustrated in FIG. 1, the donor concentration of the semiconductor substrate 10 can be adjusted by controlling the dose amounts of the charged particles and the hydrogen ions. Therefore, the semiconductor device 100 can be manufactured using a semiconductor substrate 10 having a bulk donor concentration that does not correspond to the characteristics and the like of the device. The variation in the bulk donor concentration at the time of manufacturing the semiconductor substrate 10 is relatively large, but the dose amounts of the charged particles and the hydrogen ions can be controlled with relatively high accuracy. Therefore, the concentration of lattice defects generated by implanting the charged particles can be controlled with high accuracy, and the concentration of hydrogen attached to lattice defects can also be controlled with high accuracy. Therefore, the donor concentration in the passed-through region 106 can be controlled with high accuracy.

Further, it is preferable that the hydrogen implanted into the first depth position Z1 diffuses toward the upper surface 21 to a position farther away. As a result, the length of the passed-through region 106 in the Z axis direction can be increased, and the doping concentration can be easily adjusted over a wide region of the semiconductor substrate 10.

If impurities other than the above-mentioned hydrogen ions and charged particles are implanted between the first depth position Z1 and the second depth position Z2, many lattice defects are formed in the vicinity of the implantation position. The diffusion of hydrogen ions is suppressed in the region where many lattice defects are formed. Therefore, if a region having a high-density lattice defect exists between the first depth position Z1 and the second depth position Z2, the diffusion of hydrogen ions is suppressed.

In general, a plurality of doping concentration peaks are provided in the buffer region 20 in order to suppress the spreading of the depletion layer while suppressing the electric field strength. The doping concentration peak closest to the lower surface 23 side among the plurality of doping concentration peaks is set to have the maximum concentration in order to prevent the depletion layer from reaching the lower surface region 201. However, if the buffer region 20 has the plurality of doping concentration peaks and the hydrogen donor is intended to be formed in the passed-through region 106, the diffusion of implanted hydrogen into the maximum concentration peak of the buffer region 20 is hindered by the lattice defect formed at the positions of the other doping concentration peaks. Therefore, hydrogen may not have been diffused throughout the passed-through region 106.

In the present example, the buffer region 20 has the single first doping concentration peak 111. As a result, the diffusion of hydrogen is not suppressed in at least the buffer region 20. Therefore, the hydrogen implanted into the first depth position Z1 is easily diffused toward the upper surface 21.

Figure 2:
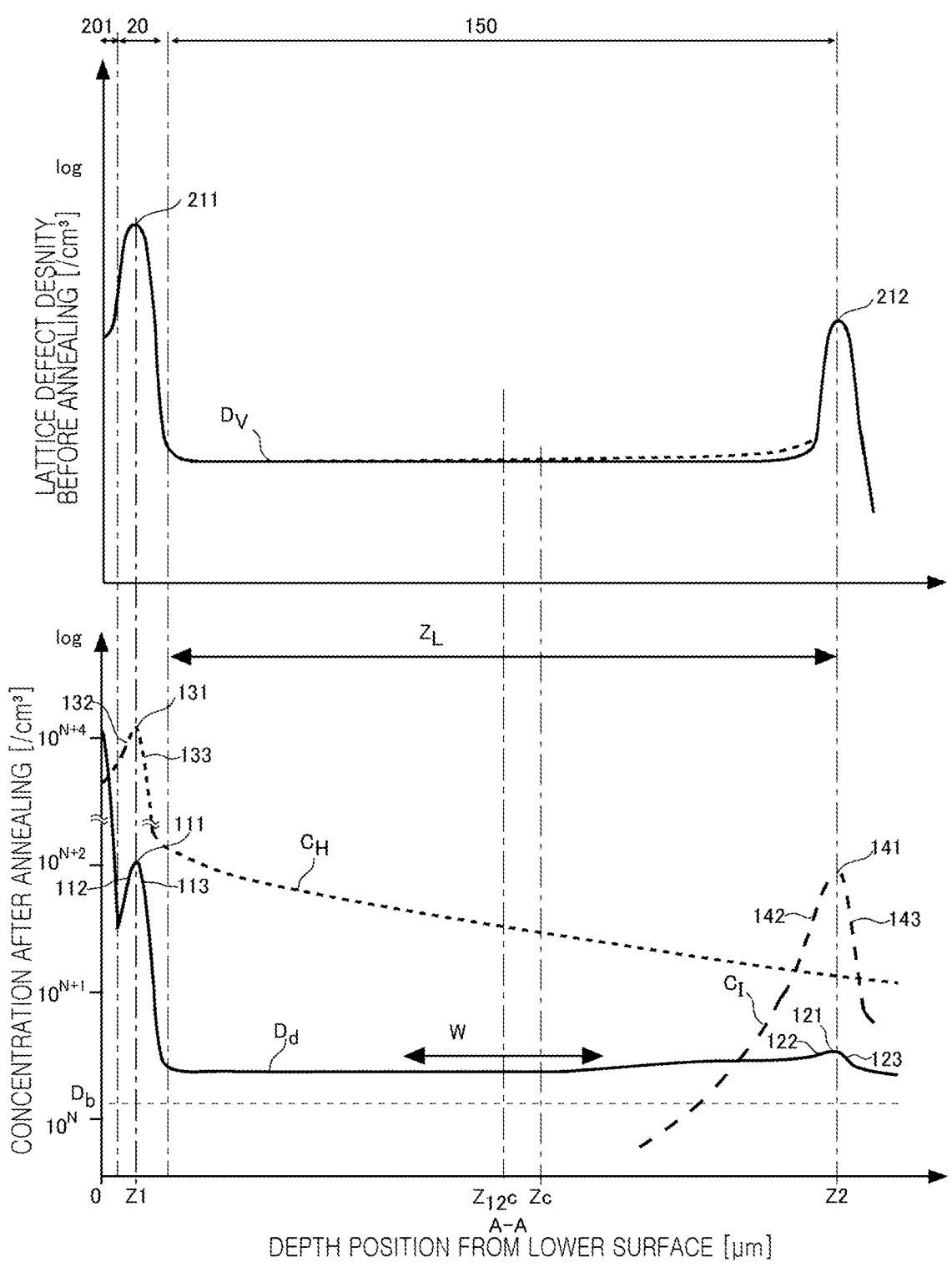
FIG. 2 illustrates the distributions of a lattice defect density $D_V$, a hydrogen chemical concentration $C_H$, a doping concentration $D_d$, and an impurity chemical concentration $C_I$ in a depth direction at positions illustrated by line A-A in FIG. 1.

FIG. 2 illustrates the distributions of a lattice defect density $D_V$, a hydrogen chemical concentration $C_H$, a doping concentration $D_d$, and an impurity chemical concentration $C_I$ in the depth direction at positions illustrated by line A-A in FIG. 1. The impurities of the present example are helium or hydrogen. The horizontal axis of FIG. 2 represents the depth position from the lower surface 23, and the vertical axis illustrates the hydrogen chemical concentration, the donor concentration, and the impurity chemical concentration per unit volume on a logarithmic axis. Among the distributions of FIG. 2, the lattice defect density $D_v$ is a distribution before annealing, and the other distributions show distributions after implanting hydrogen ions and charged particles (impurities) and annealing.

The hydrogen chemical concentration and the impurity chemical concentration in FIG. 2 are measured by, for example, the SIMS method. The doping concentration in FIG. 2 is an electrically activated doping concentration measured by, for example, the CV method or the SRP method.

The hydrogen chemical concentration $C_H$ of the present example has a hydrogen chemical concentration peak 131 at the first depth position Z1. The hydrogen chemical concentration peak 131 shows a local maximum value at the first depth position Z1.

The impurity chemical concentration $C_I$ of the present example has an impurity chemical concentration peak 141 at the second depth position Z2. The impurity chemical concentration peak 141 shows a local maximum value at the second depth position Z2.

The doping concentration $D_d$ has the first doping concentration peak 111 and the second doping concentration peak 121. The doping concentration $D_d$ may have a doping concentration peak in the lower surface region 201. The lower surface region 201 of the present example has a P type doping concentration peak. A P type dopant such as boron may be implanted into the lower surface region 201. In another example, the lower surface region 201 may have an N type doping concentration peak. In this case, an N type dopant such as phosphorus may be implanted into the lower surface region 201.

The first doping concentration peak 111 of the present example is a concentration peak of a hydrogen donor (VOH defect) in which the lattice defect caused by the implantation of hydrogen ions into the first depth position Z1 and hydrogen implanted into the first depth position Z1 are attached. Therefore, the first doping concentration peak 111 shows a local maximum value at the first depth position Z1.

The second doping concentration peak 121 is a concentration peak of a hydrogen donor in which the lattice defect caused by the implantation of charged particles into the second depth position Z2 and hydrogen diffused from the first depth position Z1 are attached. Therefore, the second doping concentration peak 121 shows a local maximum value at the second depth position Z2.

Note that the position where the first doping concentration peak 111 shows a local maximum value may not exactly coincide with the first depth position Z1. For example, if the position showing that the first doping concentration peak 111 is a local maximum value is within the range of a full width at half maximum of the first hydrogen chemical concentration peak 131 with respect to the first depth position Z1, the first doping concentration peak 111 may be assumed to be disposed substantially at the first depth position Z1. Similarly, if the position showing that the second doping concentration peak 121 is a local maximum value is within the range of a full width at half maximum of the impurity chemical concentration peak 141 with respect to the second depth position Z2, the second doping concentration peak 121 may be assumed to be disposed substantially at the second depth position Z2.

When the first doping concentration peak 111 overlaps with the doping concentration peak of the lower surface region 201 and it is difficult to distinguish the first doping concentration peak 111, the doping concentration at the depth position Z1 of the local maximum of the hydrogen chemical concentration peak 131 may be set as the first doping concentration peak 111.

Each concentration peak has a lower tail in which the concentration decreases from the local maximum toward the lower surface 23 and an upper tail in which the concentration decreases from the local maximum toward the upper surface 21. In the present example, the hydrogen chemical concentration peak 131 has a lower tail 132 and an upper tail 133. The impurity chemical concentration peak 141 has the lower tail 142 and an upper tail 143. The first doping concentration peak 111 has a lower tail 112 and an upper tail 113. The second doping concentration peak 121 has a lower tail 122 and an upper tail 123.

Since hydrogen ions are implanted from the lower surface 23 into the first depth position Z1, a relatively large amount of hydrogen exists also between the first depth position Z1 and the lower surface 23. Similarly, there are many impurities implanted as charged particles between the second depth position Z2 and the lower surface 23. Therefore, at each concentration peak in each chemical concentration distribution, the concentration may decrease more steeply in the upper tail than in the lower tail. Since the doping concentration depends on the hydrogen chemical concentration or the impurity chemical concentration, the concentration may decrease more steeply in the upper tail than in the lower tail at each doping concentration peak.

A relatively large number of lattice defects are formed by the implantation of hydrogen ions or charged particles in the vicinity of the first depth position Z1 and the second depth position Z2. Therefore, the lattice defect density $D_V$ has a first defect density peak 211 at the first depth position Z1 and a second defect density peak 212 at the second depth position Z2. In the passed-through region 106 from the second depth position Z2 to the lower surface 23 (see FIG. 1), the lattice defects generated by the passing-through of the charged particles are formed at a substantially uniform density except the vicinity of the first depth position Z1 and the second depth position Z2. As illustrated by the dotted line in the distribution diagram of the lattice defect density $D_V$ of FIG. 2, the lattice defect density $D_V$ may gradually increase toward the peak 212 within a range not exceeding the peak 212. Even when the lattice defect density $D_V$ increases toward the peak 212 in this way, the lattice defects generated by the passing-through of the charged particles may be formed at a substantially uniform density.

The hydrogen implanted into the first depth position Z1 diffuses toward the upper surface 21 by annealing processing. In the present example, the buffer region 20 has the single first doping concentration peak 111. As a result, no defect density peak other than the first defect density peak 211 exists in the buffer region 20. Therefore, hydrogen is likely to diffuse from the first depth position Z1 to the second depth position Z2. A VOH defect (hydrogen donor) is formed in the region where hydrogen having a concentration equal to or more than a certain concentration is diffused in the passed-through region 106, and the high-concentration region 150 containing a hydrogen donor is formed. The high-concentration region 150 is a region where the donor concentration is higher than the bulk donor concentration $D_b$. The high-concentration region 150 is disposed between the buffer region 20 and the upper surface 21 of the semiconductor substrate 10.

The high-concentration region 150 may be a region having a substantially uniform doping concentration in the depth direction. The substantially uniform doping concentration in the depth direction may indicate, for example, a state where a region in which the difference between the maximum value and the minimum value of the doping concentration is within 50% of the maximum value of the doping concentration is continuous in the depth direction. The difference may be 30% or less, or 10% or less, of the maximum value of the doping concentration in the region.

Alternatively, with respect to the average concentration of the doping concentration distribution in a predetermined range in the depth direction, the value of the doping concentration distribution may be within ±50%, within ±30%, or within ±10% of the average concentration of the doping concentration distribution. A predetermined range W in the depth direction may be as follows as an example. That is, the length from the first depth position Z1 to the second depth position Z2 is $Z_L$, and a section with a length of $0.5Z_L$ between two points separated by $0.25Z_L$ from the center $Z_{12}c$ between Z1 and Z2, toward the first depth position Z1 side and the second depth position Z2 side, may be set as the range. Depending on the length of the high-concentration region 150, the length of the predetermined range may be set as $0.75Z_L$, $0.3Z_L$, or $0.9Z_L$. The end position on the upper surface 21 side of the buffer region 20 may be a depth position where the substantially uniform doping concentration in the high-concentration region 150 begins to monotonically increase toward the first doping concentration peak 111.

Note that, in the measurement result of the distribution of the doping concentration $D_d$, a minute peak caused by noises or the like at the time of measurement may be included even in the region where the dopant is not implanted. In the present example, the peak at the doping concentration $D_d$ may indicate a peak in which a ratio between the minimum value and the maximum value of the doping concentration Dd within a length of 10 μm is 1.1 times or more. The ratio may be 1.2 times or more, or may be 1.5 times or more. Similarly, each chemical concentration may also indicate a peak having the ratio.

It is preferable that there are no doping concentration peaks other than the first doping concentration peak 111 and the second doping concentration peak 121 between the first depth position Z1 and the second depth position Z2. It is preferable that there are no chemical concentration peaks other than the hydrogen chemical concentration peak 131 and the impurity chemical concentration peak 141 between the first depth position Z1 and the second depth position Z2. It is preferable that there are no defect density peaks other than the first defect density peak 211 and the second defect density peak 212 between the first depth position Z1 and the second depth position Z2. As a result, the hydrogen is likely to diffuse from the first depth position Z1 to the second depth position Z2.

Facilitating the diffusion of hydrogen allows the high-concentration region 150 to be formed easily long in the depth direction. The high-concentration region 150 may be continuously provided from the first doping concentration peak 111 to the impurity chemical concentration peak 141. The high-concentration region 150 may be continuously provided from the upper end of the buffer region 20 to the second depth position Z2.

The length of the high-concentration region 150 in the depth direction may be 50% or more, 60% or more, 70% or more, or 80% or more of the thickness of the semiconductor substrate 10 in the depth direction. The length of the high-concentration region 150 in the depth direction may be 70 μm or more, 80 μm or more, 90 μm or more, or 100 μm or more. In the present example, hydrogen is easily diffused to the second depth position Z2, so that the range in which the high-concentration region 150 is formed is easily defined by the second depth position Z2.

The minimum value of the donor concentration of the high-concentration region 150 is higher than the bulk donor concentration $D_b$ of the semiconductor substrate 10. That is, the donor concentration (or doping concentration) of the high-concentration region 150 is higher than the bulk donor concentration $D_b$ over the entire high-concentration region 150. The donor concentration of the high-concentration region 150 is determined by the sum of the bulk donor concentration and the hydrogen donor concentration (VOH defect concentration). The hydrogen donor concentration can be accurately controlled by the dose amount of the charged particles with respect to the second depth position Z2 and the dose amount of the hydrogen ions with respect to the first depth position Z1. Therefore, by making the hydrogen donor concentration sufficiently higher than the bulk donor concentration, it is possible to reduce the variation in the donor concentration of the high-concentration region 150 even when the bulk donor concentration varies. The donor concentration of the high-concentration region 150 may be 2 times or more, 5 times or more, or 10 times or more of the bulk donor concentration $D_b$.

Figure 3:
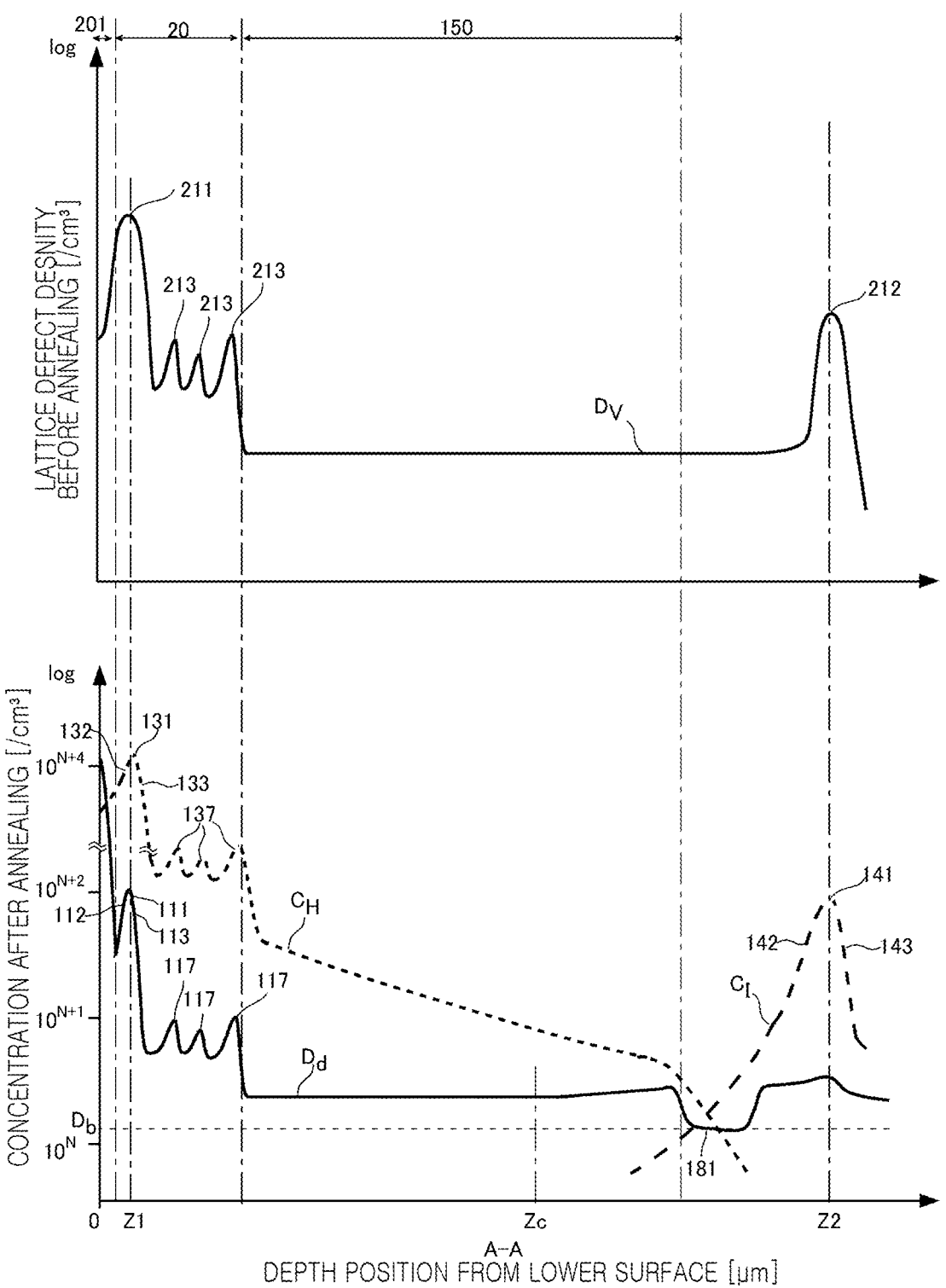
FIG. 3 illustrates the distributions of the lattice defect density $D_V$, the hydrogen chemical concentration $C_H$, the doping concentration $D_d$, and the impurity chemical concentration $C_I$ according to a comparative example.

FIG. 3 illustrates the distributions of the lattice defect density $D_V$, the hydrogen chemical concentration $C_H$, the doping concentration $D_d$, and the impurity chemical concentration $C_I$ according to a comparative example. The semiconductor device of the comparative example includes one or more doping concentration peaks 117 on the upper surface 21 side than the first doping concentration peak 111 in the buffer region 20. Each doping concentration peak 117 is formed by implanting hydrogen ions as an example.

The hydrogen chemical concentration $C_H$ of the present example, includes a hydrogen chemical concentration peak 137 at the same depth position as each doping concentration peak 117. The lattice defect density $D_V$ includes a defect density peak 213 at the same depth position as each hydrogen chemical concentration peak 137. That is, the buffer region 20 includes one or more defect density peaks 213 on the upper surface 21 side than the first depth position Z1.

In the example of FIG. 3, the hydrogen chemical concentration peak 131 is a high concentration equal to or more than 10 times the other hydrogen chemical concentration peaks 137. Therefore, most hydrogen diffused from the buffer region 20 to the upper surface 21 side is hydrogen implanted into the first depth position Z1. However, the diffusion of hydrogen implanted into the first depth position Z1 is hindered by the defect density peak 213. For example, hydrogen is attached to lattice defects, or the presence of lattice defects impedes hydrogen movement.

Therefore, in the example of FIG. 3, hydrogen is not sufficiently diffused to the second depth position Z2. In this case, the high-concentration region 150 is not formed up to the second depth position Z2, and a low-concentration region 181 having a low donor concentration remains. The donor concentration of the low-concentration region 181 may be the same degree as the bulk donor concentration $D_b$. When many lattice defects remain in the low-concentration region 181, the carrier concentration of the low-concentration region 181 may be lower than the bulk donor concentration $D_b$. Since almost no hydrogen donor is formed in the low-concentration region 181, the donor concentration of the low-concentration region 181 is greatly affected by the bulk donor concentration. Therefore, the donor concentration of the low-concentration region 181 has a relatively large variation. A valley-shaped portion is formed in the doping concentration distribution, which may affect the characteristics of the semiconductor device 100. On the other hand, according to the semiconductor device 100 illustrate in FIG. 2, since the high-concentration region 150 can be formed widely, the variation in the doping concentration can be suppressed, and the characteristics of the semiconductor device 100 can be adjusted accurately.

Note that, in the buffer region 20, it is conceivable to increase the concentration of the hydrogen chemical concentration peak 137 closest to the upper surface 21. This makes it easier to diffuse hydrogen up to a position close to the upper surface 21. However, if the hydrogen chemical concentration peak 137 near the upper surface 21 is made high, the depletion layer will reach the doping concentration peak of a high concentration in a state where the emitter-collector voltage is relatively high, and avalanche withstand-capability may decrease. According to the example illustrate in FIG. 2, the high-concentration region 150 can be formed up to the vicinity of the upper surface 21 while suppressing the decrease in the avalanche withstand-capability by disposing the first doping concentration peak 111 of a high concentration in the vicinity of the lower surface 23. The distance between the first depth position Z1 and the lower surface 23 may be 5 μm or less, or may be 3 μm or less.

Figure 4:
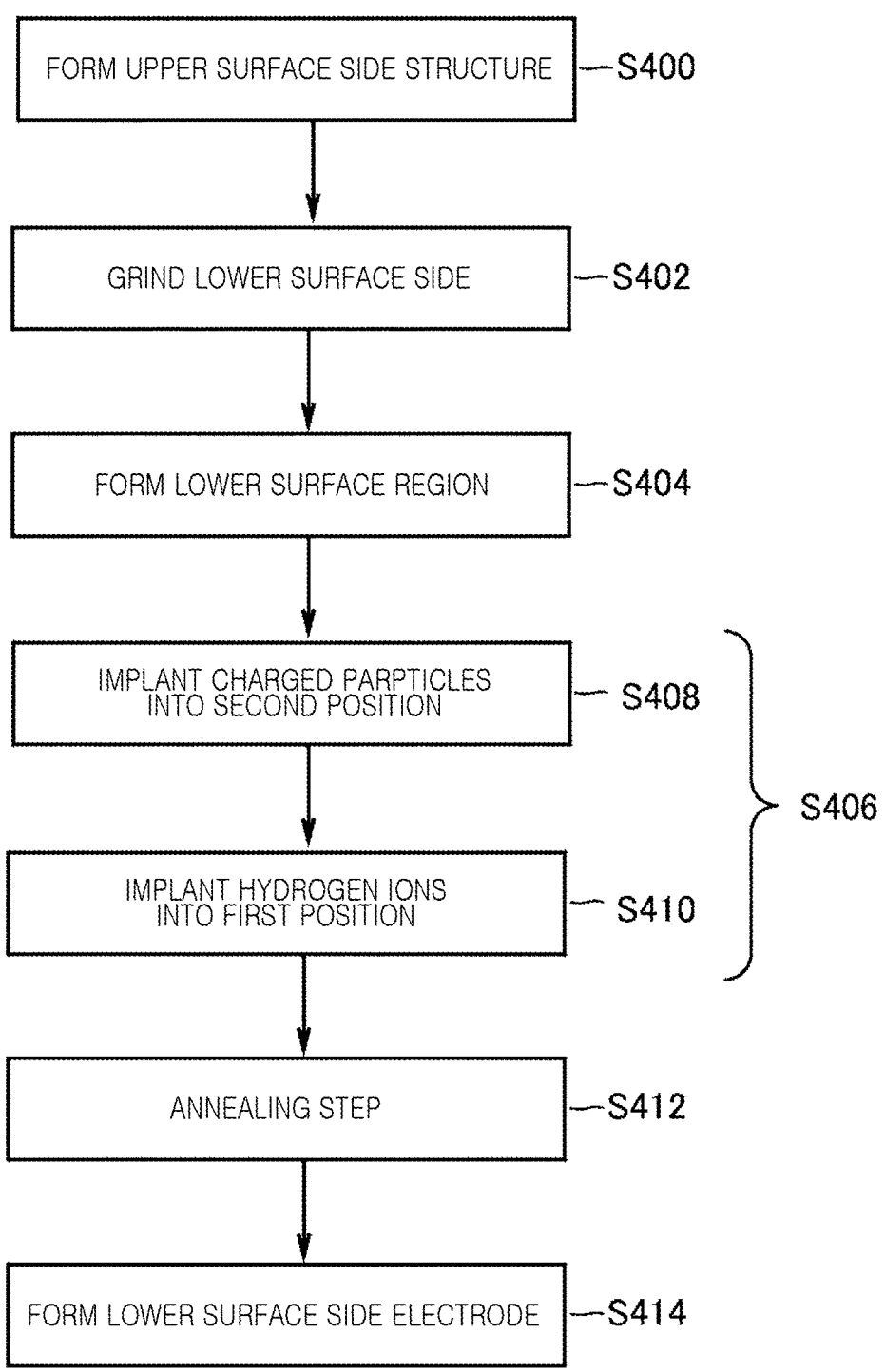
FIG. 4 is a flowchart illustrating an example of a manufacturing method of the semiconductor device 100.

FIG. 4 is a flowchart illustrating an example of a manufacturing method of the semiconductor device 100. First, in an upper surface side structure forming step S400, the structure on the upper surface 21 side of the semiconductor substrate 10 is formed. The structure on the upper surface 21 side includes at least some of a gate trench, a dummy trench, an emitter region, a base region, an accumulation region, an interlayer dielectric film, an emitter electrode, and a gate runner, which will be described later. In the upper surface side structure forming step S400, all these structures may be formed.

Next, in a grinding step S402, the lower surface 23 side of the semiconductor substrate 10 is ground to adjust the thickness of the semiconductor substrate 10. In the grinding step S402, the thickness of the semiconductor substrate 10 may be adjusted according to the breakdown voltage that the semiconductor device 100 should have.

Next, in a lower surface region forming step S404, the lower surface region 201 is formed in the region in contact with the lower surface 23 of the semiconductor substrate 10. In the lower surface region forming step S404, the lower surface region 201 may be formed by implanting an N type dopant or a P type dopant from the lower surface 23 and locally annealing the vicinity of the lower surface 23 with a laser or the like.

Next, in a first implantation step S406, the charged particles and the hydrogen ions are implanted into the semiconductor substrate 10. The first implantation step S406 has a charged particle implantation step S408 and a hydrogen implantation step S410. In the charged particle implantation step S408, the charged particles are implanted from the lower surface 23 of the semiconductor substrate 10 to the second depth position Z2. The charged particles may be, for example, hydrogen ions, helium ions, or electrons. In the hydrogen implantation step S410, the hydrogen ions are implanted from the lower surface 23 of the semiconductor substrate 10 to the first depth position Z1. In the hydrogen implantation step S410, the hydrogen ions are implanted into the first depth position Z1 such that the hydrogen chemical concentration distribution has a single peak in the region on the lower surface 23 side rather than the second depth position Z2. Note that, when the hydrogen ions are implanted into the second depth position Z2, the peak of the hydrogen chemical concentration may exist at the second depth position Z2. Either the charged particle implantation step S408 or the hydrogen implantation step S410 may be performed first.

Next, the semiconductor substrate 10 is annealed in an annealing step S412. In the annealing step S412, the semiconductor substrate 10 is put into an annealing furnace, and the entire semiconductor substrate 10 is annealed. By the annealing step S412, the high-concentration region 150 is formed between the first depth position Z1 and the second depth position Z2. The annealing step S412 is preferably performed under the condition that the hydrogen implanted into the first depth position Z1 can diffuse to the second depth position Z2. For example, the annealing temperature of the annealing step S412 is 350° C. or higher and 400° C. or lower. The annealing temperature may be 360° C. or higher and may be 380° C. or lower. The annealing time in the annealing step S412 may be 30 minutes or more, 1 hour or more, or 3 hours or more. The annealing time may be 10 hours or less, or may be 7 hours or less.

Next, in a lower surface side electrode forming step S414, a metal electrode is formed in the lower surface 23 of the semiconductor substrate 10. The metal electrode may be a collector electrode described later. The lattice defect may be locally formed by implanting impurities such as helium into the semiconductor substrate 10 between the annealing step S412 and the lower surface side electrode forming step S414, so that the lifetime of the carrier may be adjusted.

Figure 5:
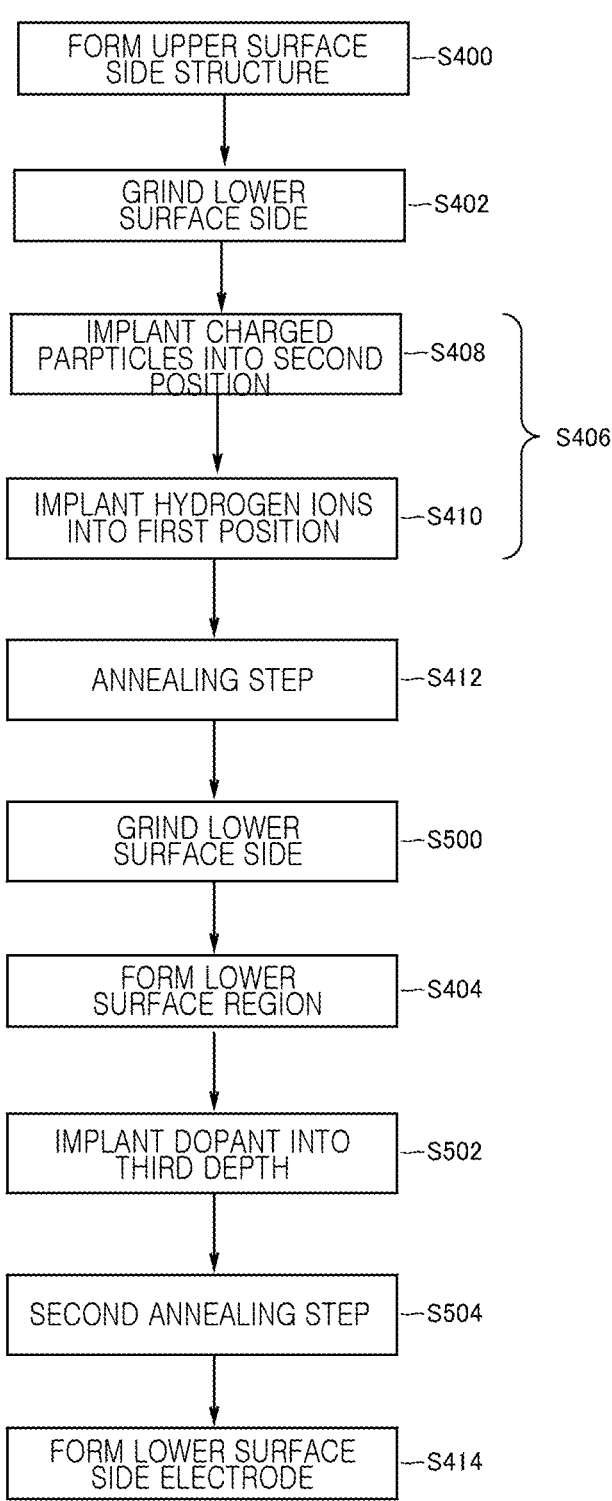
FIG. 5 is a flowchart illustrating another example of the manufacturing method of the semiconductor device 100.

FIG. 5 is a flowchart illustrating another example of the manufacturing method of the semiconductor device 100. The manufacturing method of the present example is different from the example illustrated in FIG. 4 in that a grinding step S500, a second implantation step S502, and a second annealing step S504 are further included. Other steps may be similar to the example illustrate in FIG. 4. However, in the present example, the lower surface region forming step S404 is not performed before the first implantation step S406.

In the present example, the lower surface 23 side of the semiconductor substrate 10 is ground in the grinding step S500 after the first annealing step S412 In the grinding step S500, the lower surface 23 is ground such that the region including the first depth position Z1 is removed from the semiconductor substrate 10. In the grinding step S500, the grinding may be performed such that a part of the upper tail 113 of the first doping concentration peak 111 remains in the semiconductor substrate 10 or the upper tail 113 does not remain in the semiconductor substrate 10. In the grinding step S500, the semiconductor substrate 10 may be ground such that the high-concentration region 150 is exposed at the lower surface 23.

In the present example, the thickness of the semiconductor substrate 10 which has been ground in the grinding step S402 and the grinding step S500 becomes a thickness corresponding to a predetermined breakdown voltage. The amount of grinding in the grinding step S402 and the grinding step S500 may be set arbitrarily. The grinding step S402 may be omitted. Next, the lower surface region 201 is formed in the lower surface region forming step S404.

Next, in the second implantation step S502, an N type dopant is implanted into a third depth position Z3. The third depth position Z3 is a position where the buffer region 20 should be formed. The N type dopant may be hydrogen, or may be a dopant other than hydrogen such as phosphorus.

Next, the semiconductor substrate 10 is annealed in the second annealing step S504. In the second annealing step S504, the N type dopant implanted into the third depth position Z3 is activated to be a donor. As a result, the buffer region 20 can be formed. In the second annealing step S504, the entire semiconductor substrate 10 may be annealed, or may be locally annealed. Next, in the lower surface side electrode forming step S414, a metal electrode is formed in the lower surface 23 of the semiconductor substrate 10.

Figure 6:
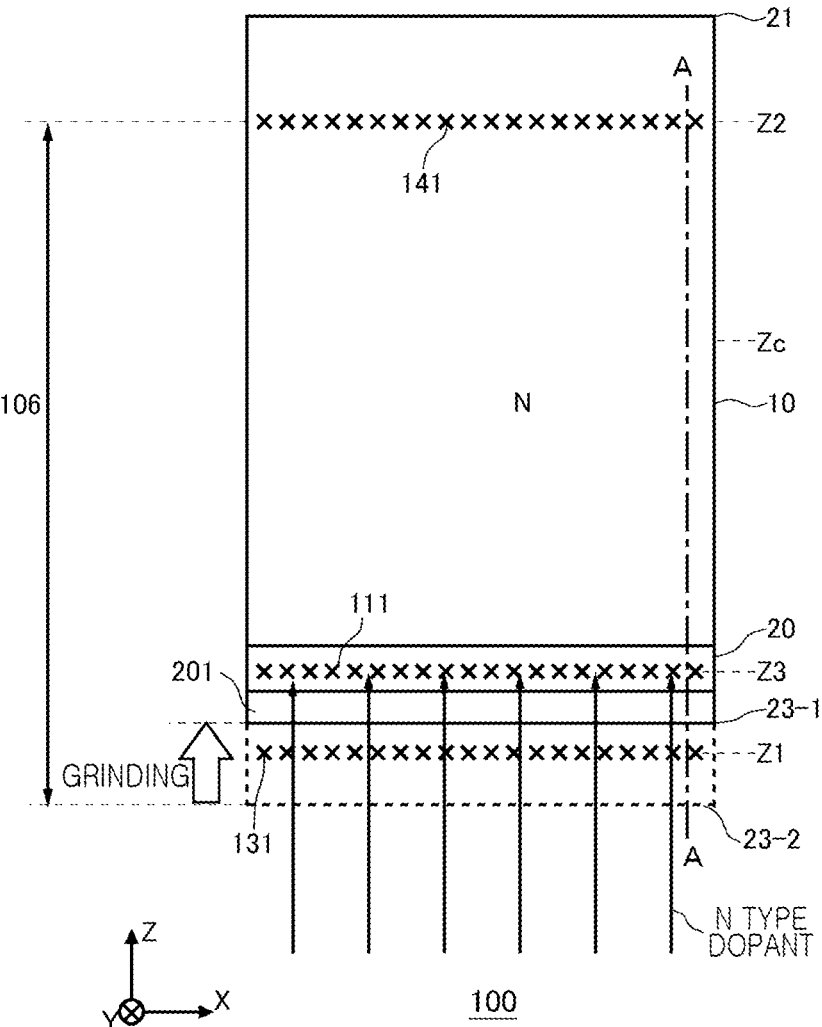
FIG. 6 is a diagram for explaining the semiconductor device 100 according to the manufacturing method of FIG. 5.

FIG. 6 is a diagram for explaining the semiconductor device 100 according to the manufacturing method of FIG. 5. The lower surface of the semiconductor substrate 10 before being ground in the grinding step S500 is set to a lower surface 23-2, and the lower surface after grinding is set to a lower surface 23-1.

In the first implantation step S406, the hydrogen ions are implanted from a lower surface 23-2 to the first depth position Z1, and the charged particles are implanted from the lower surface 23-2 to the second depth position Z2. Hydrogen implanted into the first depth position Z1 is diffused by the first annealing step S412.

Next, the lower surface 23-2 is ground by the grinding step S500 to remove the region including the first depth position Z1. Next, in the lower surface region forming step S404, the lower surface region 201 is formed in the region in contact with the lower surface 23-1.

Next, an N type dopant is implanted into the third depth position Z3 by the second implantation step S502. Next, the semiconductor substrate 10 is annealed in the second annealing step S504, so that the N type dopant implanted into the third depth position Z3 is activated and the buffer region 20 is formed.

Figure 7:
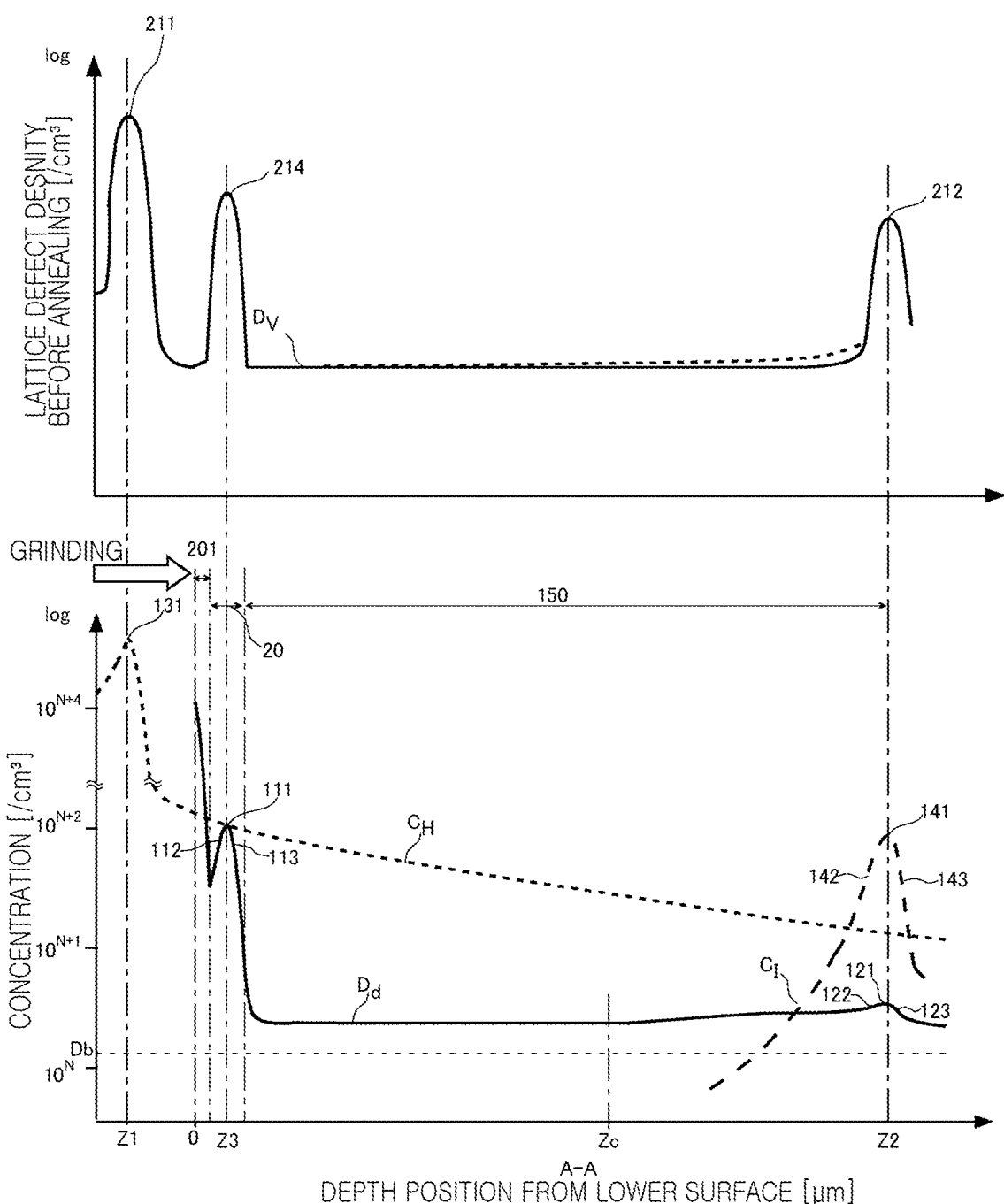
FIG. 7 illustrates the distributions of the lattice defect density $D_V$, the hydrogen chemical concentration $C_H$, the doping concentration $D_d$, and the impurity chemical concentration $C_I$ in the depth direction at positions illustrated by line A-A in FIG. 6.

FIG. 7 illustrates the distributions of the lattice defect density $D_V$, the hydrogen chemical concentration $C_H$, the doping concentration $D_d$, and the impurity chemical concentration $C_I$ in the depth direction at the positions illustrated by line A-A in FIG. 6. The impurities of the present example are helium or hydrogen. Among the distributions of FIG. 7, the lattice defect density $D_V$ shows a lattice defect density formed when hydrogen ions are implanted into the first depth position Z1, the second depth position Z2, and the third depth position Z3. That is, in the lattice defect density $D_V$, the lattice defect formed when the lower surface region 201 is formed is omitted. Similarly to the example of FIG. 2, the lattice defect density $D_V$ may gradually increase toward the peak 212 within a range not exceeding the peak 212. In FIG. 7, an aspect that the lattice defect density $D_V$ increases is illustrated with a dotted line. Even when the lattice defect density $D_V$ increases toward the peak 212 in this way, the lattice defects generated by the passing-through of the charged particles may be formed at a substantially uniform density. The density also including the lattice defect made into a hydrogen donor by annealing is illustrated. Concentrations other than lattice defect density show the distributions after the second annealing step S504 is performed.

Hydrogen of a high concentration is implanted into the first depth position Z1 in order to diffuse the hydrogen up to the second depth position Z2. Therefore, the hydrogen donor having a concentration higher than the hydrogen donor having a concentration that the buffer region 20 should have may be formed at the first depth position Z1.

In the present example, the region including the first depth position Z1 is ground by the grinding step S500 after diffusing the hydrogen implanted into the first depth position Z1. Then, an N type dopant having a concentration that the buffer region 20 should have is implanted into the third depth position Z3. As a result, the buffer region 20 having an appropriate concentration is easily formed while forming the high-concentration region 150 in a wide range. Note that a defect density peak 214 is formed by implanting the N type dopant into the third depth position Z3. However, the forming of the defect density peak 214 is formed after the first annealing step S412, so that the diffusion of hydrogen implanted into the first depth position Z1 is not hindered.

In the present example, the hydrogen chemical concentration peak 131 at the first depth position Z1 is removed. However, the hydrogen chemical concentration CH decreases slowly from the lower surface 23 toward the second depth position Z2.

In the example of FIG. 7, an N type dopant other than hydrogen is implanted into the third depth position Z3. That is, the first doping concentration peak 111 is a concentration peak of an N type dopant other than the hydrogen donor. In another example, hydrogen may be implanted into the third depth position Z3. In this case, the first doping concentration peak 111 is the concentration peak of the hydrogen donor. The hydrogen chemical concentration $C_H$ has a chemical concentration peak (not illustrated) at the first depth position Z1.

Figure 8:
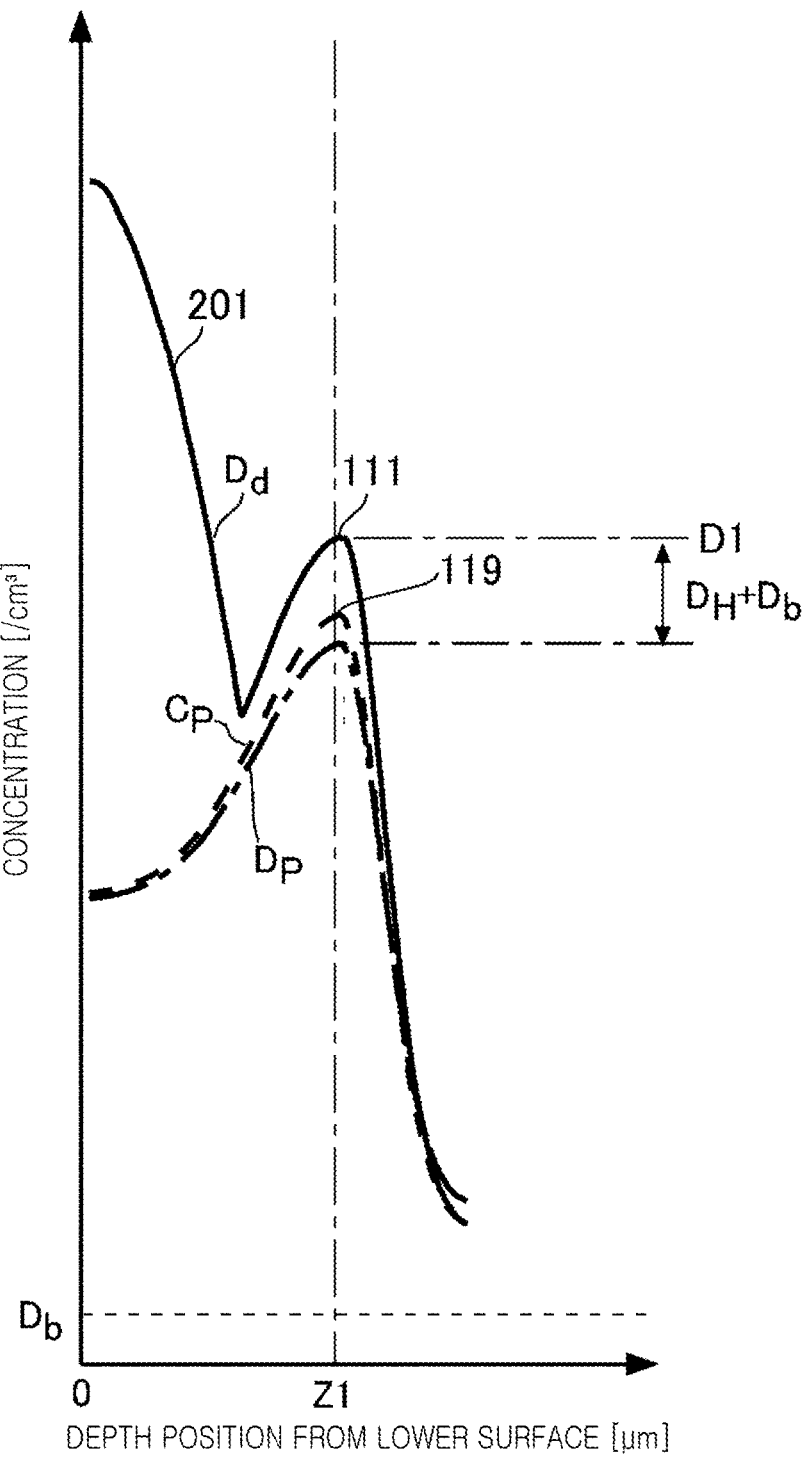
FIG. 8 is a diagram illustrating another example of a first doping concentration peak 111.

FIG. 8 is a diagram illustrating another example of the first doping concentration peak 111. The first doping concentration peak 111 of the present example may be applied to each example explained in FIG. 1 to FIG. 7. The first doping concentration peak 111 of the present example is a concentration peak including both the hydrogen donor and an N type dopant other than the hydrogen donor. As an example, the N type dopant is phosphorus. In another example, the N type dopant is selenium or sulfur.

In the present example, phosphorus is implanted from the lower surface 23 to the first depth position Z1 to form the first doping concentration peak 111. In FIG. 8, the phosphorus chemical concentration $C_P$ is illustrated with a broken line. The phosphorus chemical concentration $C_P$ has a chemical concentration peak 119 at the first depth position Z1. The doping concentration $D_P$ of phosphorus which has been activated to be a donor is illustrated with a chain line. The doping concentration $D_P$ is a concentration obtained by multiplying the activation rate of phosphorus to the phosphorus chemical concentration $C_P$. The activation rate of phosphorus may be set as 1. In this case, the phosphorus chemical concentration $C_P$ may be used as the doping concentration $D_P$.

A doping concentration D1 of the first doping concentration peak 111 is substantially equal to the sum of the doping concentration $D_P$ corresponding to the phosphorus chemical concentration $C_P$, the concentration $D_H$ of the hydrogen donor, and the bulk donor concentration $D_b$. Hydrogen may be implanted into the first depth position Z1 in the semiconductor substrate 10. In this case, the hydrogen chemical concentration $C_H$ has a peak at the first depth position Z1. In another example, the hydrogen chemical concentration $C_H$ may not have a peak at the first depth position Z1. For example, the first doping concentration peak 111 may contain the hydrogen donor which has been formed by diffusing the hydrogen implanted into the ground region as illustrated in FIG. 7.

The implanting of the N type dopant such as phosphorus may be performed after the implanting of the hydrogen ions. In this case, it is preferable that the vicinity of the first depth position Z1 is locally annealed with a laser or the like after the N type dopant is implanted. As a result, the decrease in the hydrogen donor contained in the semiconductor substrate 10 can be suppressed.

Figure 9A:
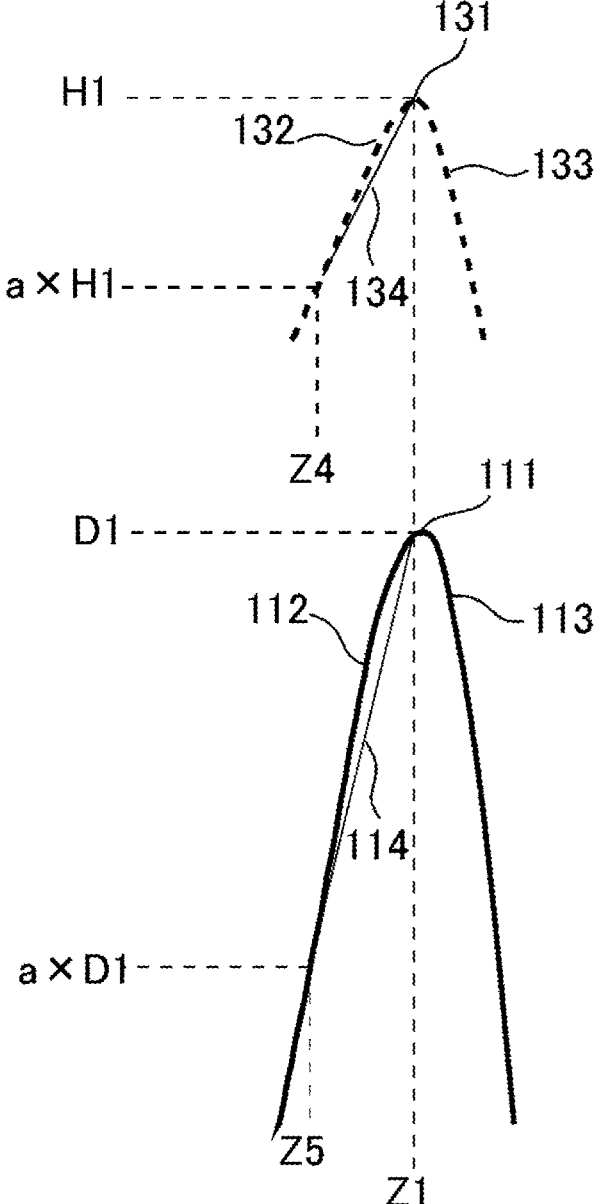
FIG. 9A is a diagram for explaining the relationship between a hydrogen chemical concentration peak 131 and the first doping concentration peak 111.

FIG. 9A is a diagram for explaining the relationship between the hydrogen chemical concentration peak 131 and the first doping concentration peak 111. In the present example, a gradient 114 of the lower tail 112 of the first doping concentration peak 111 is normalized by using a gradient 134 of the lower tail 132 of the hydrogen chemical concentration peak 131. Normalization is a process of dividing the gradient 114 by the gradient 134 as an example.

The gradient of the lower tail may be the gradient between the position where the concentration shows a local maximum value and the position where the concentration becomes a predetermined ratio to the local maximum value. The predetermined ratio may be 80%, 50%, 10%, or 1%, and any other ratio may be used. In the hydrogen chemical concentration peak 131 and the first doping concentration peak 111, the gradient of the concentration distribution between the first depth position Z1 and the lower surface 23 of the semiconductor substrate 10 may be used.

In the example illustrate in FIG. 9A, the gradient 134 of the hydrogen chemical concentration peak 131 is given by (H1−aH1)/(Z1−Z4), and the gradient 114 of the first doping concentration peak 111 is given by (D1−aD1)/(Z1−Z5). H1 is the hydrogen chemical concentration at the first depth position Z1, D1 is the doping concentration at the first depth position Z1, a is a predetermined ratio, Z4 is the depth at which the hydrogen concentration becomes aH1 at the lower tail 132 of the hydrogen chemical concentration peak 131, and Z5 is the depth at which the doping concentration becomes aD1 at the lower tail 112 of the first doping concentration peak 111. For example, if the gradient 114 is normalized with the gradient 134, it becomes (D1−aD1) (Z1−Z4)/{(H1−aH1)(Z1−Z5)}. The gradient obtained by normalizing the gradient 114 with the gradient 134 is defined as α.

Figure 9B:
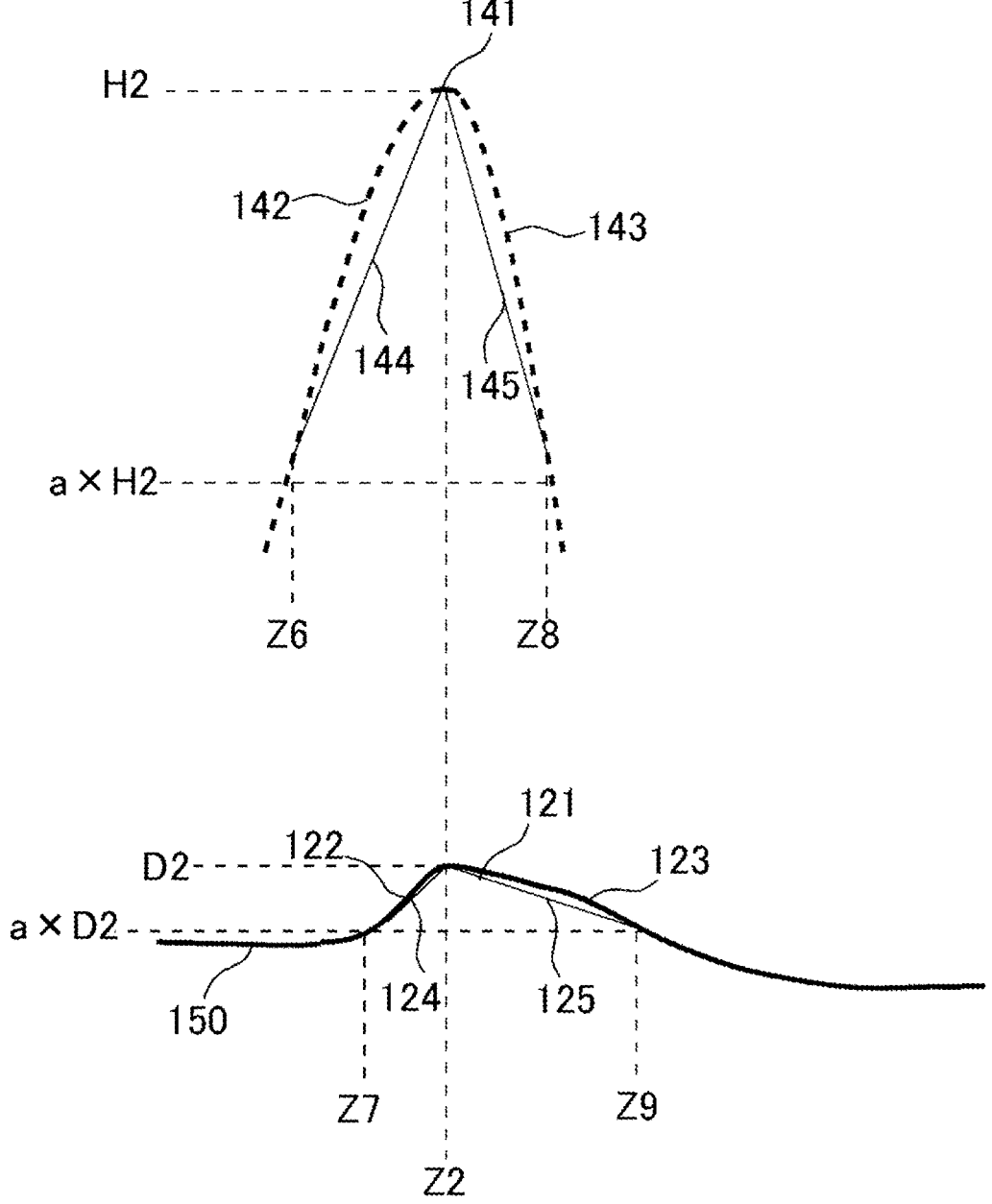
FIG. 9B is a diagram for explaining the relationship between an impurity chemical concentration peak 141 and a second doping concentration peak 121.

FIG. 9B is a diagram for explaining the relationship between the impurity chemical concentration peak 141 and the second doping concentration peak 121. In the present example, the hydrogen ions are implanted as the charged particles to the second depth position Z2. In the present example, a gradient 144 of the lower tail 142 of the impurity chemical concentration peak 141 is used to normalize a gradient 124 of the lower tail of the second doping concentration peak 121.

In the example illustrate in FIG. 9B, the gradient 144 of the impurity chemical concentration peak 141 is given by (H2−aH2)/(Z2−Z6), and the gradient 124 of the second doping concentration peak 121 is given by (D2−aD2)/(Z2−Z7). H2 is the hydrogen chemical concentration at the second depth position Z2, D2 is the doping concentration at the second depth position Z2, a is a predetermined ratio, Z6 is the depth at which the hydrogen chemical concentration becomes aH2 at the lower tail 142 of the impurity chemical concentration peak 141, and Z7 is the depth at which the doping concentration becomes aD2 at the lower tail 122 of the second doping concentration peak 121. The ratio a used to normalize the gradient of the second doping concentration peak 121 may be the same as or different from the ratio a used to normalize the gradient of the first doping concentration peak 111. For example, if the gradient 124 is normalized with the gradient 144, it becomes (D2−aD2)(Z2−Z6)/{(Z2−Z7)(H2−aH2)}. The gradient obtained by normalizing the gradient 124 with the gradient 144 is defined as β.

The normalized gradient β of the lower tail 122 of the second doping concentration peak 121 is smaller than the normalized gradient a of the lower tail 112 of the first doping concentration peak 111. That is, the second doping concentration peak 121 is a gentler peak with respect to the peak of the hydrogen chemical concentration as compared with the first doping concentration peak 111. By implanting hydrogen ions so that such a second doping concentration peak 121 is formed, the high-concentration region 150 having a flat concentration distribution can be formed. By forming the second doping concentration peak 121 into a gentle shape, it is possible to moderate the change in the doping concentration at the edge of the high-concentration region 150. The normalized gradient β of the lower tail 122 of the second doping concentration peak 121 may be 1 times or less, 0.1 times or less, or 0.01 times or less than the normalized gradient a of the lower tail of the first doping concentration peak 111.

The gradient 144 of the lower tail 142 of the impurity chemical concentration peak 141 may be smaller than a gradient 145 of the upper tail 143. The chemical concentration distribution of hydrogen implanted at a deep position from the lower surface 23 may draw a gentle tail toward the lower surface 23 side. Therefore, it may be possible to determine whether the hydrogen implanted into the second depth position Z2 has been implanted from the lower surface 23 side by comparing the gradient 144 of the lower tail 142 with the gradient 145 of the upper tail 143. The gradient 145 is given as (H2−aH2)/(Z8−Z2). The gradient 125 is given as (D2−aD2)/(Z9−Z2). Z8 is the depth at which the hydrogen chemical concentration becomes aH2 at the upper tail 143 of the impurity chemical concentration peak 141, and Z9 is the depth at which the doping concentration becomes aD2 at the upper tail 123 of the second doping concentration peak 121. Note that, in FIG. 9B, the gradient 124 of the lower tail 122 of the second doping concentration peak 121 is larger than the gradient 125 of the upper tail 123, but similarly to the impurity chemical concentration peak 141, the gradient 124 of the lower tail 122 of the second doping concentration peak 121 may be smaller than the gradient 125 of the upper tail 123.

Figure 9C:
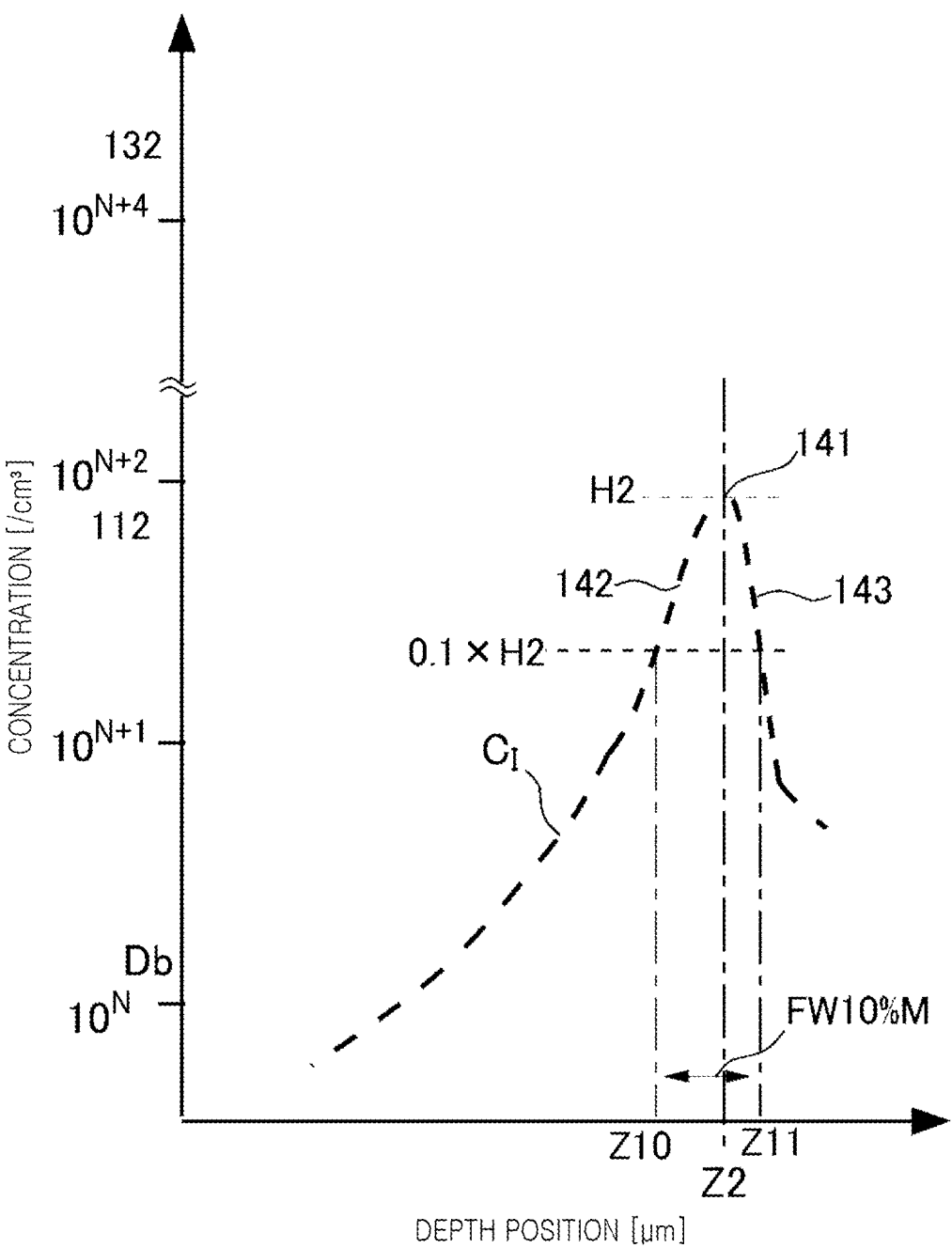
FIG. 9C is a diagram for explaining the gradient of a lower tail 142.

FIG. 9C is a diagram for explaining the gradient of the lower tail 142. The gradient of the lower tail 142 may be considered as follows. As illustrate in FIG. 9C, at the impurity chemical concentration peak 141, the width (10% full width) between two positions Z10 and Z11, where the concentration becomes 10% (0.1×H2) of a peak concentration H2, is defined as FW10% M. The two positions Z10 and Z11 are the two positions with the second depth position Z2 sandwiched therebetween and closest to the second depth position Z2 among the points where the hydrogen chemical concentration becomes 0.1×H2. The position on the hydrogen chemical concentration peak 131 side in the two positions Z10 and Z11 is defined as Z10. The gradient of the doping concentration at a position Z10 is almost flat. The gradient of the hydrogen chemical concentration at the position Z10 exceeds 100 times the gradient of the doping concentration at the position Z10. For example, the gradient of the hydrogen chemical concentration at the position Z10 may be 100 times or more, or 1000 times or more the gradient of the doping concentration at the position Z10.

Figure 10A:
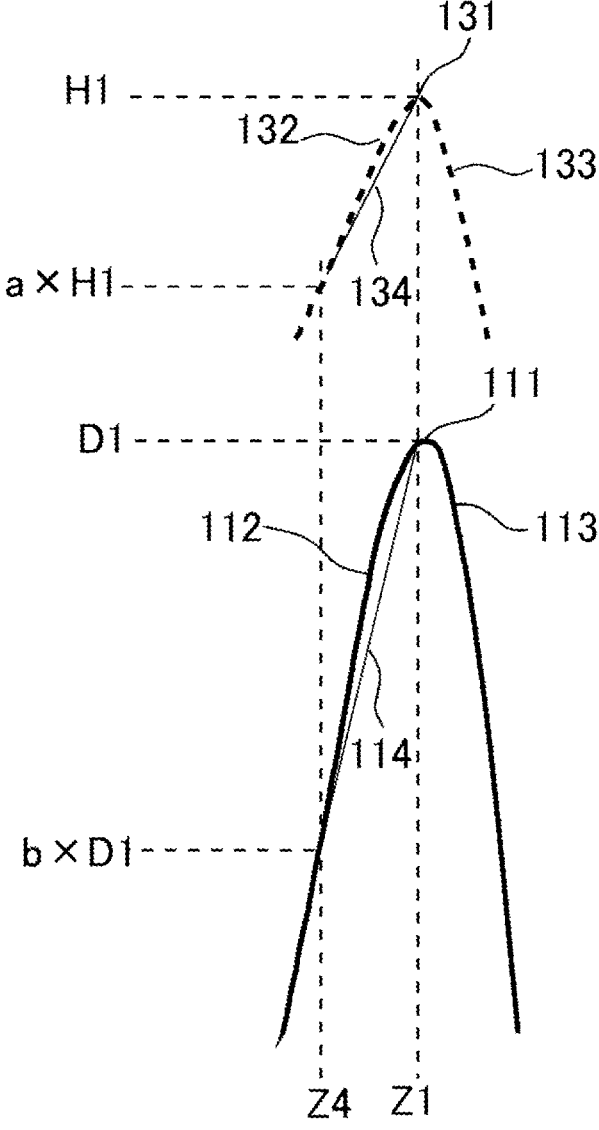
FIG. 10A is a diagram for explaining another definition of normalization of the gradient of a lower tail 112.

FIG. 10A is a diagram for explaining another definition of normalization of the gradient of the lower tail 112. In normalization of the gradient of the lower tail 112, for example, the following index γ is introduced. In the example of FIG. 9A, the position Z4 and the position Z5 are different, but in the present example, the position Z4 and the position Z5 are set to the same position (Z4=Z5). The position Z4 is a predetermined position here. The position Z4 may be a position where the hydrogen chemical concentration $C_H$ and the doping concentration $D_d$ are at the lower tails 132 and 112 on the lower surface 23 side of the first depth position Z1. The hydrogen chemical concentration at the position Z4 is defined as a×H1, and the doping concentration is defined as b×D1. a is the ratio of the hydrogen chemical concentration at the position Z4 to the concentration H1 of the hydrogen chemical concentration peak 131 at the first depth position Z1. b is the ratio of the doping concentration at the position Z4 to the concentration D1 of the first doping concentration peak 111 at the first depth position Z1. Here, the ratios of the gradients of the hydrogen chemical concentration and the doping concentration in a section Z4 to Z1 and a gradient ratio γ obtained by normalizing the ratios of the gradients are introduced. The ratio of the gradient of the hydrogen chemical concentration in the section Z4 to Z1 is defined as (H1/aH1)/(Z1−Z4). Similarly, the ratio of the gradient of the donor concentration in the section Z4 to Z1 is defined as (D1/bD1)/(Z1−Z4). Then, the gradient ratio γ, which is the ratio of the gradient of the hydrogen chemical concentration in the section Z4 to Z1 and is obtained by normalizing the ratio of the gradient of the doping concentration, is defined as {(D1/bD1)/(Z1−Z4)}/{(H1/aH1)/(Z1−Z4)}. The normalized gradient ratio γ becomes a simple ratio a/b by calculating the above equation.

Figure 10B:
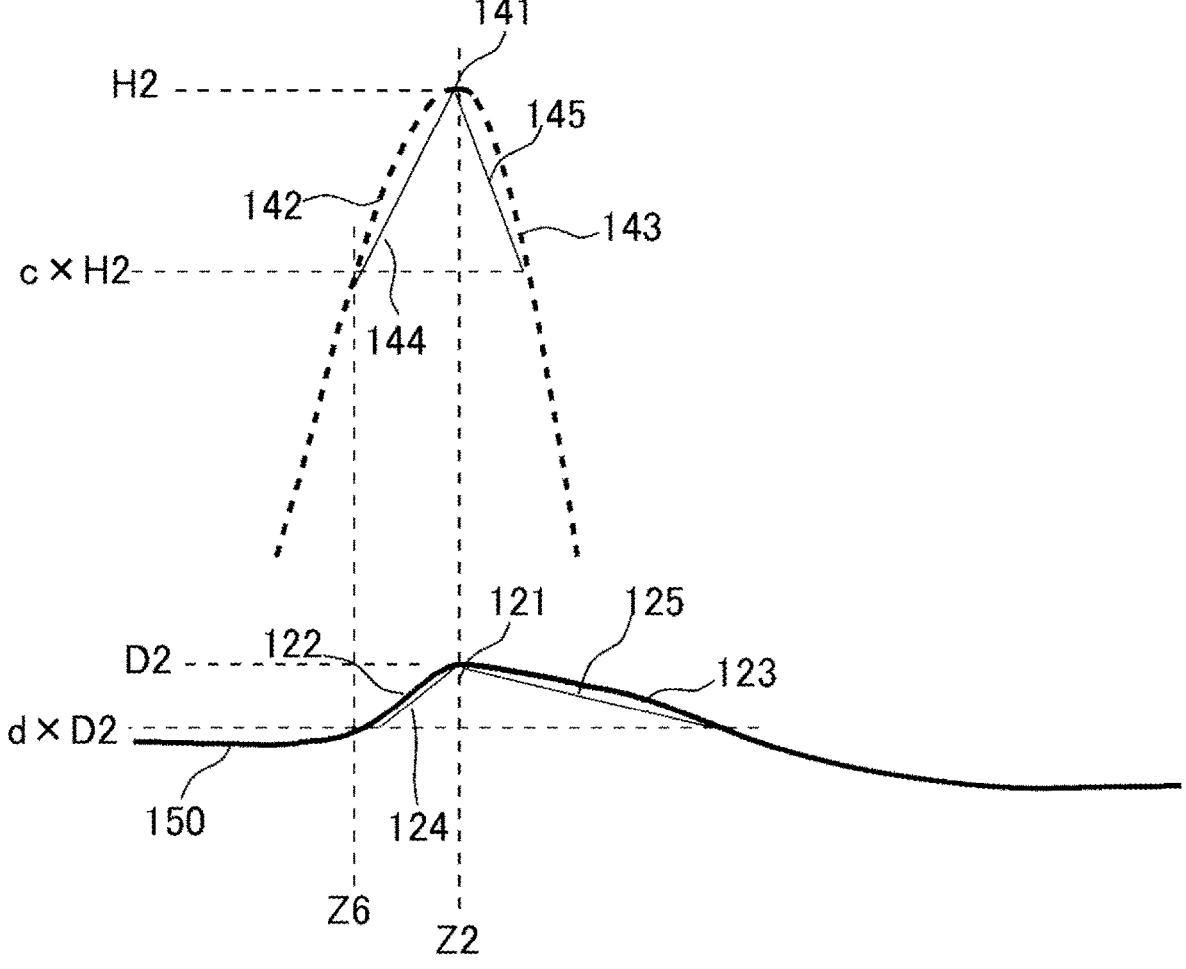
FIG. 10B is a diagram for explaining another definition of normalization of the gradient of a lower tail 122.

FIG. 10B is a diagram for explaining another definition of normalization of the gradient of the lower tail 122. In normalization of the gradient of the lower tail 122, for example, an index ε similar to the index γ is introduced. In the example of FIG. 9B, the position Z6 and the position Z7 are different, but in the present example, the position Z6 and the position Z7 are set to the same position (Z6=Z7). The position Z6 is a predetermined position here. The position Z6 may be a position where the hydrogen chemical concentration and the doping concentration are at the lower tails 142 and 122 on the lower surface 23 side of the second depth position Z2. The hydrogen chemical concentration at the position Z6 is defined as c×H2, and the doping concentration is defined as d×D2. c is the ratio of the hydrogen chemical concentration at the position Z6 to the hydrogen chemical concentration H2 at the second depth position Z2. d is the ratio of the doping concentration at the position Z6 to the concentration D2 of the second doping concentration peak 121 at the second depth position Z2. Here, the ratios of the gradients of the hydrogen chemical concentration and the doping concentration in a section Z6 to Z2 and a gradient ratio ε obtained by normalizing the ratios of the gradients are introduced. The ratio of the gradient of the hydrogen chemical concentration in the section Z6 to Z2 is defined as (H2/cH2)/(Z2−Z6). Similarly, the ratio of the gradient of the doping concentration in the section Z6 to Z2 is defined as (D2/dD2)/(Z2–Z6). Then, the gradient ratio ε, which is the ratio of the gradient of the hydrogen chemical concentration in the section Z6 to Z2 and is obtained by normalizing the ratio of the gradient of the doping concentration, is defined as {(D2/dD2)/(Z2–Z6)}/{(H2/cH2)/(Z2–Z6)}. The normalized gradient ratio ε becomes a simple ratio (c/d) by calculating the above equation.

For the hydrogen chemical concentration peak 131 and the first doping concentration peak 111, the hydrogen chemical concentration distribution and the doping concentration distribution often have similar shapes in many cases. Here, the similar shape means that the doping concentration distribution exhibits, for example, a distribution to which the hydrogen chemical concentration distribution is reflected when the horizontal axis is the depth and the vertical axis is the common logarithm of the concentration. That is, in the predetermined section Z4 to Z1, hydrogen ions are implanted and further the annealing is performed, so that the doping concentration distribution becomes a distribution to which the hydrogen chemical concentration distribution is reflected. As an example, if H1 of the hydrogen chemical concentration peak 131 is $1 \times 10^{17}$ atoms/cm$^3$ and the hydrogen chemical concentration aH1 at the position Z4 is $2 \times 10^{16}$ atoms/cm$^3$, a becomes 0.2. On the other hand, if D1 of the first doping concentration peak 111 is $1 \times 10^{16}$/cm$^3$ and the doping concentration bD1 at the position Z4 is $2 \times 10^{15}$/cm$^3$, b becomes 0.2. Therefore, the normalized gradient ratio γ becomes 1 because it is a/b. That is, at the first depth position Z1 near the lower surface 23, the ratio a of the gradient of the hydrogen chemical concentration distribution and the ratio b of the gradient of the doping concentration distribution become almost the same value, and it can be said that they have similar shapes.

On the other hand, for the impurity chemical concentration peak 141 and the second doping concentration peak 121, the hydrogen chemical concentration distribution and the doping concentration distribution may not have similar shapes. That is, in the predetermined section Z6 to Z2, the doping concentration distribution may not reflect the hydrogen chemical concentration distribution. As an example, if the hydrogen chemical concentration H2 of the impurity chemical concentration peak 141 is $1 \times 10^{16}$ atoms/cm$^3$ and the hydrogen chemical concentration cH2 at the position Z6 is $1 \times 10^{15}$ atoms/cm$^3$, c becomes 0.1. On the other hand, if the concentration D2 of the second doping concentration peak 121 is $3 \times 10^{14}$/cm$^3$ and the doping concentration dD2 at the position Z6 is $1.5 \times 10^{14}$/cm$^3$, d becomes 0.5. Therefore, the normalized gradient ratio ε becomes 0.2 because it is c/d. That is, at the second depth position Z2 sufficiently deep from the lower surface 23, the ratio c of the gradient of the hydrogen chemical concentration distribution becomes 0.2 times smaller than the ratio d of the gradient of the doping concentration distribution, and it can be said that they show different shapes.

Comparing the normalized gradient ratios γ and ε, γ becomes close to 1 when the peak position of the hydrogen chemical concentration distribution is close to the lower surface 23, and ε may become a value sufficiently higher than 1 when the peak position of the hydrogen chemical concentration distribution is sufficiently deep from the lower surface 23. That is, the normalized gradient ratio ε may be larger than the normalized gradient ratio γ. Further, the gradient ratio ε may be 1.1 or more, 1.5 or more, and 2 or more. Alternatively, the gradient ratio may be 10 or more, or 100 or more.

Note that the actual positions of the hydrogen chemical concentration peak 131 and the impurity chemical concentration peak 141 may differ from the actual positions of the first doping concentration peak 111 and the second doping concentration peak 121. When the position of the chemical concentration peak and the position of the doping concentration peak do not match in this way, the position of the chemical concentration peak may be set to the first depth position Z1 or the second depth position Z2. For the doping concentration, the concentration at the first depth position Z1 or the second depth position Z2 may be set as the peak position for convenience. As a result, it possible to calculate according to the above definition.

FIG. 11 to FIG. 19 are diagrams for explaining an example of a method for determining a preferred range of the bulk donor concentration and the donor concentration of the high-concentration region 150. In the present example, the bulk donor concentration and the donor concentration are set such that the final donor concentration (doping concentration) in the high-concentration region 150 becomes a relatively stable concentration even when the bulk donor concentration varies.

In the present example, the specification value of the bulk donor concentration is set to $N_{B0}$, and the actual bulk donor concentration is set to $N_{Bre}$. The specification value of the bulk donor concentration is a specification value defined by a manufacturer of semiconductor wafers. When the specification value has a width, a median value of the specification value may be used. The bulk donor concentration is given by $N = 1/q\mu\rho$ with respect to a specific resistance $\rho$ determined by the concentration of the bulk donor such as phosphorus. q is an elementary electric charge, and μ is electron mobility in the semiconductor substrate 10.

The concentration of hydrogen donors (VOH defects) is $N_H$. The variation in a hydrogen donor concentration $N_H$ is negligibly small compared to the variation in the bulk donor concentration. In the present example, the variation in the hydrogen donor concentration $N_H$ is set to 0.

The target value of the final donor concentration is defined as $N_{F0}$. The final donor concentration actually obtained is defined as $N_{Fre}$. The concentrations described above are all concentrations (/cm$^3$) per unit volume.

The target value $N_{F0}$ of the final donor concentration is obtained by adding the hydrogen donor concentration $N_H$ to the specification value $N_{B0}$ of the bulk donor concentration, and thus is given by the following Expression.

$$N_{F0} = N_H + N_{B0} \qquad \text{Expression (1)}$$

On the other hand, the actual donor concentration $N_{Fre}$ is obtained by adding the hydrogen donor concentration $N_H$ to the actual bulk donor concentration $N_{Bre}$, and thus is given by the following Expression.

$$N_{Fre} = N_H + N_{Bre} \qquad \text{Expression (2)}$$

The parameter β is defined by the following Expression.

$$\beta = N_{Bre} / N_{B0} \qquad \text{Expression (3)}$$

The parameter β is a ratio between the actual bulk donor concentration $N_{Bre}$ and the specification value $N_{B0}$, and the bulk donor concentration $N_{Bre}$ deviates from the specification value $N_{B0}$ as the parameter is far from 1.

The parameter $\gamma$ is defined by the following Expression.

$$\gamma = N_{Fre}/N_{F0} \qquad \text{Expression (4)}$$

The parameter $\gamma$ is a ratio between the actual donor concentration $N_{Fre}$ and the target value $N_{F0}$ and the actual donor concentration $N_{Fre}$ deviates from the target value $N_{F0}$ as the parameter is far from 1. That is, when $\gamma$ is sufficiently close to 1, even when the actual bulk donor concentration $N_{Bre}$ deviates by $\beta$ times from the specification value $N_{H0}$, the actual donor concentration $N_{Fre}$ substantially matches the target value $N_{F0}$ almost independently of $\beta$.

Here, the specific resistance variation of a silicon wafer manufactured by the FZ method in which the variation in the bulk donor concentration is relatively small is generally as follows.

Neutron-irradiated FZ wafer . . . ±8% (ratio 0.92 to 1.08)

Gas-doped FZ wafer . . . ±12% (ratio 0.88 to 1.12)

Therefore, when $\gamma$ is 0.85 or more and 1.15 or less, the variation in the final donor concentration $N_{Fre}$ is substantially the same as the bulk donor concentration of the silicon wafer of the FZ method described above. In the present specification, the allowable value of $\gamma$ is 0.85 or more and 1.15 or less.

The actual donor concentration $N_{Fre}$ is affected by the variation ($\beta$) in the actual bulk donor concentration $N_{Bre}$. On the other hand, the variation in the hydrogen donor concentration $N_H$ can be regarded as almost 0 as compared with the variation in the bulk donor concentration $N_{Bre}$. Therefore, by reducing the specification value $N_{B0}$ of the bulk donor concentration with respect to the target value $N_{F0}$ of the donor concentration, it is possible to reduce the ratio of components that vary in the donor concentration $N_{Fre}$.

A parameter $\varepsilon'$ is defined by the following Expression.

$$N_{B0} = \varepsilon' \times N_{F0} \qquad \text{Expression (5)}$$

Here, $0 < \varepsilon' < 1$. The parameter $\varepsilon'$ is a parameter that means to set the specification value $N_{B0}$ of the bulk donor concentration by $\varepsilon'$ relative to the target value $N_{F0}$ of the donor concentration. It is examined whether $\gamma$ approaches sufficiently 1 regardless of $\beta$ when $\varepsilon'$ is set to a value smaller than 1 within a range not to be 0.

The parameter $\varepsilon$ is defined by the following Expression.

$$\varepsilon = 1/\varepsilon' \qquad \text{Expression (6)}$$

The following Expression is obtained from Expression (5) and Expression (6).

$$N_{B0} = N_{F0}/\varepsilon \qquad \text{Expression (7)}$$

The following Expression is obtained by substituting Expression (7) into Expression (1).

$$N_{F0} = N_H + N_{F0}/\varepsilon, \ i.e., \ N_H = (1 - 1/\varepsilon)N_{F0} \qquad \text{Expression (8)}$$

The following Expression is obtained by substituting Expression (8) and Expression (3) into Expression (2).

$$N_{Fre} = (1 - 1/\varepsilon)N_{F0} + \beta N_{B0} \qquad \text{Expression (9)}$$

The following Expression is obtained by substituting Expression (7) into Expression (9).

$$N_{Fre} = (1 - 1/\varepsilon)N_{F0} + (\beta/\varepsilon)N_{F0} \qquad \text{Expression (10)}$$
$$= (1 - 1/\varepsilon + \beta/\varepsilon)N_{F0}$$

The following Expression is obtained by substituting Expression (10) into Expression (4).

$$\gamma = 1 - 1/\varepsilon + \beta/\varepsilon \qquad \text{Expression (11)}$$
$$= 1 + (\beta - 1)/\varepsilon$$

The following Expression is obtained from Expression (6) and Expression (11).

$$\gamma = 1 + \varepsilon'(\beta - 1) \qquad \text{Expression (12)}$$

Figure 11:
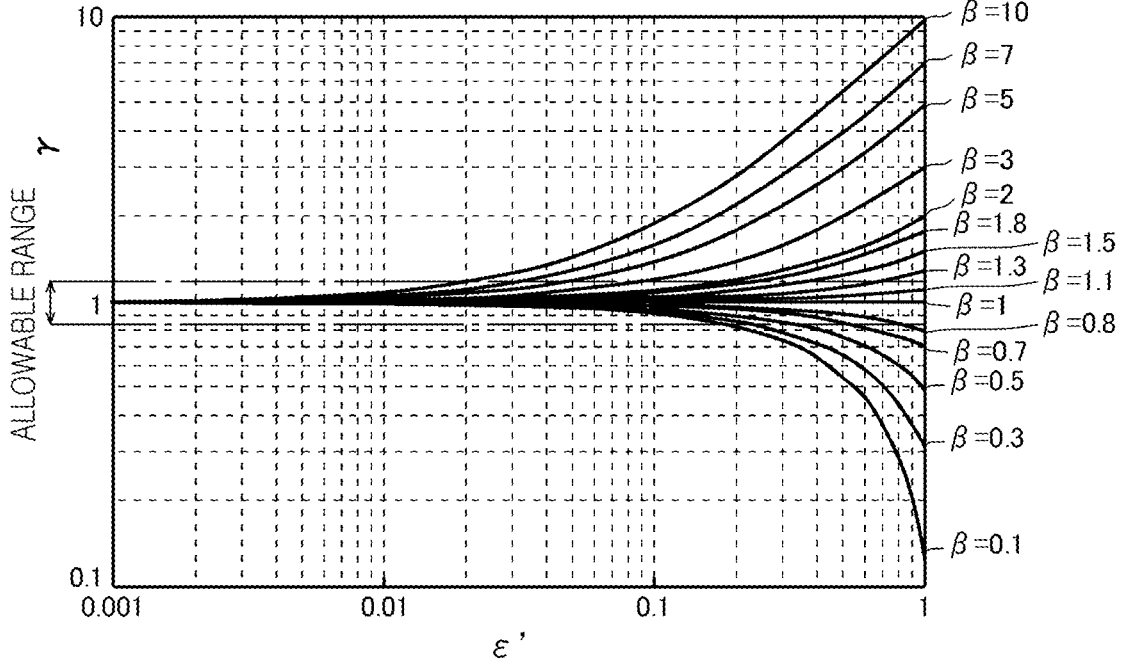
FIG. 11 is a graph illustrating the relationship between ε and γ indicated by Expression (12) for each β.

FIG. 11 is a graph illustrating the relationship between $\varepsilon'$ and $\gamma$ represented by Expression (12) for each $\beta$. As described above, $\gamma$ represents the ratio of the actual donor concentration $N_{Fre}$ to the target value $N_{F0}$, and $\beta$ represents the ratio of the actual bulk donor concentration $N_{Bre}$ to the specification value $N_{B0}$. The allowable value of $\gamma$ is 0.85 or more and 1.15 or less.

For example, the specification value $N_{B0}$ of the bulk donor concentration is 0.5 times or less the target value $N_{F0}$ of the donor concentration, that is, $\varepsilon'$ is 0.5 or less. In this case, for example, even when $\beta$ is 1.3, $\gamma$ is 1.15 or less and falls within an allowable range. That is, even when the actual bulk donor concentration $N_{Bre}$ is 30% higher than the specification value $N_{B0}$, the actual donor concentration $N_{Fre}$ is 1.15 times or less the target value $N_{F0}$. In addition, even when $\beta$ is 0.7, if $\varepsilon'$ is 0.5 or less, $\gamma$ is within the allowable range. As $\varepsilon'$ approaches 0, $\gamma$ converges to 1. For example, in the case of $\beta=2$, if $\varepsilon'$ is approximately 0.2 or less, $\gamma$ falls within the allowable range.

In order to make $\gamma$ within the above-mentioned allowable range, for example, the following ranges A to D are conceivable as preferred ranges of $\varepsilon'$. (Range A)

$\varepsilon'$ is 0.001 or more and 0.5 or less. In a case where $\varepsilon'$ is 0.5, if $\beta$ is within a range of 0.7 to 1.3, $\gamma$ is within the allowable range. For example, when the specification value $N_{B0}$ of the bulk donor concentration is $1 \times 10^{14}/cm^3$ and $\varepsilon'$ is 0.001, the target value $N_{F0}$ of the donor concentration is $1 \times 10^{11}/cm^3$, corresponding to about 46000 $\Omega$cm.

(Range B)

$\varepsilon'$ is 0.01 or more and 0.333 or less. In a case where $\varepsilon'$ is 0.333, if $\beta$ is within a range of 0.5 to 1.5, $\gamma$ is within the allowable range. For example, when the specification value $N_{B0}$ of the bulk donor concentration is $1 \times 10^{14}/cm^3$ and $\varepsilon'$ is 0.01, the target value $N_{F0}$ of the donor concentration is $1 \times 10^{12}/cm^3$, corresponding to about 4600 $\Omega$cm.

(Range C)

$\varepsilon'$ is 0.03 or more and 0.25 or less. In a case where $\varepsilon'$ is 0.25, if $\beta$ is within a range of roughly 0.4 to 1.6, $\gamma$ is within the allowable range. For example, when the specification value $N_{B0}$ of the bulk donor concentration is $1 \times 10^{14}/\text{cm}^3$ and $\varepsilon'$ is 0.03, the target value $N_{F0}$ of the donor concentration is $3 \times 10^{12}/\text{cm}^3$, corresponding to about 1500 $\Omega$cm.

(Range D)

$\varepsilon'$ is 0.1 or more and 0.2 or less. In a case where $\varepsilon'$ is 0.2, if $\beta$ is within a range of roughly 0.2 to 1.8, $\gamma$ is within the allowable range. For example, when the specification value $N_{B0}$ of the bulk donor concentration is $1 \times 10^{14}/\text{cm}^3$ and $\varepsilon'$ is 0.1, the target value $N_{F0}$ of the donor concentration is $1 \times 10^{13}/\text{cm}^3$, corresponding to about 460 $\Omega$cm.

Note that, since the less variation in specific resistance is suitable for practical use, $\varepsilon'$ is preferably 0.1 or less, and more preferably 0.02 or less. In this case, for example, the following Ranges E to H are conceivable. (Range E)

$\varepsilon'$ is 0.001 or more and 0.1 or less. In a case where $\varepsilon'$ is 0.1, if $\beta$ is within a range of about 0.05 (not illustrated) to 3.0, $\gamma$ is within a sufficiently allowable range. For example, when the specification value $N_{B0}$ of the bulk donor concentration is $1 \times 10^{14}/\text{cm}^3$ and $\varepsilon'$ is 0.1, the target value $N_{F0}$ of the donor concentration is $1 \times 10^{13}/\text{cm}^3$, corresponding to about 460 $\Omega$cm.

(Range F)

$\varepsilon'$ is 0.002 or more and 0.05 or less. In a case where $\varepsilon'$ is 0.05, if $\beta$ is within a range of about 0.01 (not illustrated) to 5.0, $\gamma$ is within a sufficiently allowable range. For example, when the specification value $N_{B0}$ of the bulk donor concentration is $1 \times 10^{14}/\text{cm}^3$ and $\varepsilon'$ is 0.05, the target value $N_{F0}$ of the donor concentration is $5 \times 10^{12}/\text{cm}^3$, corresponding to about 920 $\Omega$cm.

(Range G)

$\varepsilon'$ is 0.005 or more and 0.02 or less. In a case where $\varepsilon'$ is 0.02, if $\beta$ is within a range of about 0.01 (not illustrated) to 10.0, $\gamma$ is within a sufficiently allowable range. For example, when the specification value $N_{B0}$ of the bulk donor concentration is $1 \times 10^{14}/\text{cm}^3$ and $\varepsilon'$ is 0.02, the target value $N_{F0}$ of the donor concentration is $2 \times 10^{12}/\text{cm}^3$, corresponding to about 2300 $\Omega$cm.

(Range H)

In a case where $\varepsilon'$ has a width of $0.01 \pm 0.002$ (20%). In a case where $\varepsilon'$ is 0.01, if $\beta$ is within a range of about 0.01 (not illustrated) to 20.0 (not illustrated), $\gamma$ is within a sufficiently allowable range. For example, when the specification value $N_{B0}$ of the bulk donor concentration is $1 \times 10^{14}/\text{cm}^3$ and $\varepsilon'$ is 0.01, the target value $N_{F0}$ of the donor concentration is $1 \times 10^{12}/\text{cm}^3$, corresponding to about 4600 $\Omega$cm.

As described above, the actual donor concentration $N_{Fre}$ corresponds to the donor concentration of the high-concentration region 150. The breakdown voltage of the semiconductor device 100 is almost determined by the donor concentration in the high-concentration region 150, which occupies a large region in the semiconductor substrate 10. Therefore, a preferred range of the donor concentration $N_{Fre}$ of the high-concentration region 150 is determined by the rated voltage of the semiconductor device 100. Depending on the donor concentration $N_{Fre}$, the range of the bulk donor concentration $N_{Bre}$ that can stabilize the donor concentration $N_{Fre}$ is determined.

Figure 12:
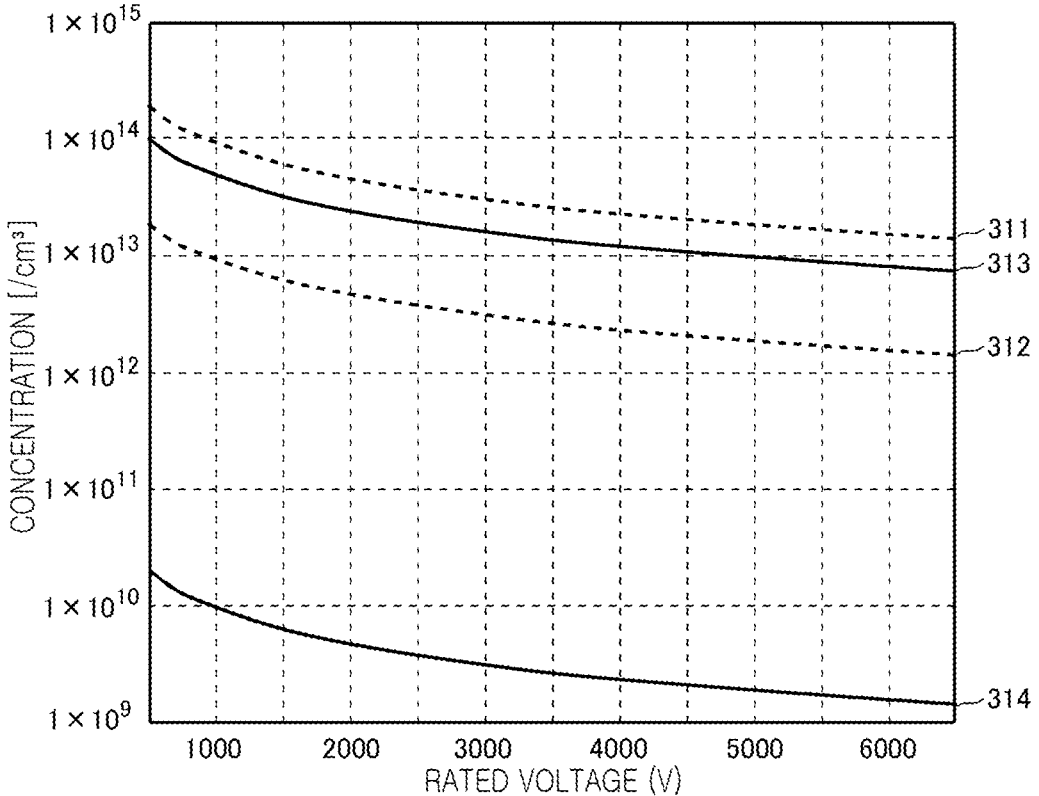
FIG. 12 is a diagram illustrating an example of a preferred range for a bulk donor concentration $N_{Bre}$.

FIG. 12 is a diagram illustrating an example of a preferred range for the bulk donor concentration $N_{Bre}$. In the present example, the donor concentration $N_{Fre}$ (/cm$^3$) at the center Zc of the semiconductor substrate 10 in the depth direction is $(9.20245 \times 10^{15})/\text{x}$ or more and $(9.20245 \times 10^{16})/\text{x}$ or less. Here, x is the rated voltage (V). The donor concentration $N_{Fre}$ (/cm$^3$) is determined with reference to the doping concentration of the drift region in the general semiconductor substrate formed by the FZ method, but may be determined with reference to the doping concentration of the drift region of the semiconductor substrate formed by the MCZ method. In FIG. 12, an upper limit 311 and a lower limit 312 of the preferred range of the donor concentration $N_{Fre}$ (/cm$^3$) are indicated by broken lines.

In FIG. 12, an upper limit 313 and a lower limit 314 of the preferred range of the bulk donor concentration $N_{Bre}$ in the case of the above-described Range A ($\varepsilon'$ is 0.001 or more and 0.5 or less) are indicated by solid lines. The upper limit 313 of the bulk donor concentration $N_{Bre}$ is a value obtained by multiplying the upper limit 311 of the donor concentration $N_{Fre}$ (/cm$^3$) by the upper limit value (0.5) of $\varepsilon'$. The lower limit 314 of the bulk donor concentration $N_{Bre}$ is a value obtained by multiplying the lower limit 312 of the donor concentration $N_{Fre}$ (/cm$^3$) by the lower limit value (0.001) of $\varepsilon'$. The upper limit 313 and the lower limit 314 of the bulk donor concentration $N_{Bre}$ are as follows. The unit of the upper limit 313 and the lower limit 314 in each example is (/cm$^3$). As described above, x is the rated voltage (V).

Lower limit 314: $(9.20245 \times 10^{12})/\text{x}$

Upper limit 313: $(4.60123 \times 10^{16})/\text{x}$

Figure 13:
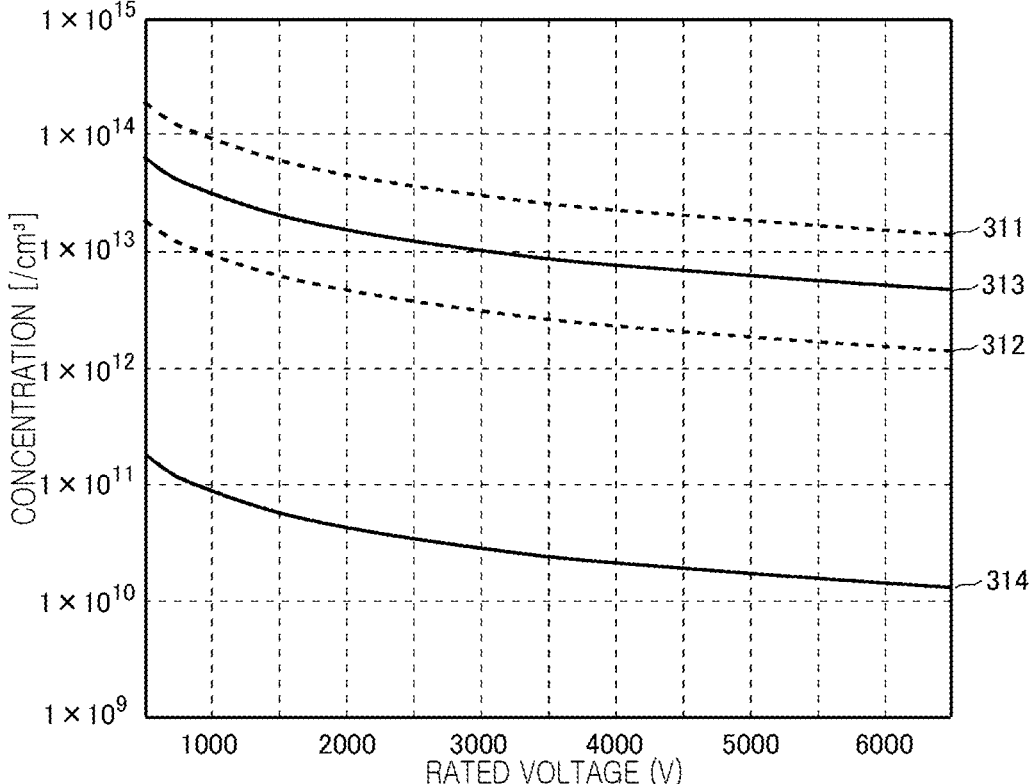
FIG. 13 is a diagram illustrating an example of a preferred range for the bulk donor concentration $N_{Bre}$ when ε' is in a range B (0.01 or more and 0.333 or less).

FIG. 13 is a diagram illustrating an example of a preferred range for the bulk donor concentration $N_{Bre}$ when $\varepsilon'$ is in a range B (0.01 or more and 0.333 or less). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.333) of $\varepsilon'$. The lower limit 314 of the bulk donor concentration $N_{Bre}$ is a value obtained by multiplying the lower limit 312 of the donor concentration $N_{Fre}$ (/cm$^3$) by the lower limit value (0.01) of $\varepsilon'$. The upper limit 313 and the lower limit 314 of the bulk donor concentration $N_{Bre}$ are as follows.

Lower limit 314: $(9.20245 \times 10^{13})/\text{x}$

Upper limit 313: $(3.06442 \times 10^{16})/\text{x}$

Figure 14:
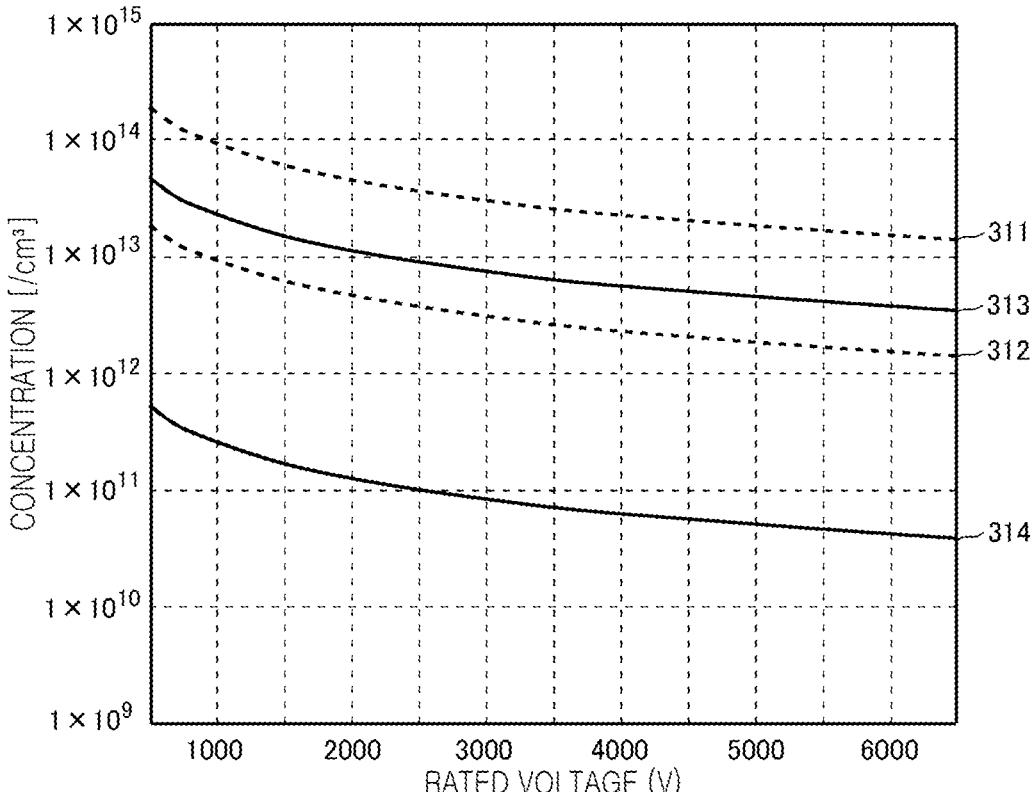
FIG. 14 is a diagram illustrating an example of a preferred range for the bulk donor concentration $N_{Bre}$ when ε' is in a range C (0.03 or more and 0.25 or less).

FIG. 14 is a diagram illustrating an example of a preferred range for the bulk donor concentration $N_{Bre}$ when $\varepsilon'$ is in a range C (0.03 or more and 0.25 or less). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.25) of $\varepsilon'$. The lower limit 314 of the bulk donor concentration $N_{Bre}$ is a value obtained by multiplying the lower limit 312 of the donor concentration $N_{Fre}$ (/cm$^3$) by the lower limit value (0.03) of $\varepsilon'$. The upper limit 313 and the lower limit 314 of the bulk donor concentration $N_{Bre}$ are as follows.

Lower limit 314: $(2.76074 \times 10^{14})/\text{x}$

Upper limit 313: $(2.30061 \times 10^{16})/\text{x}$

Figure 15:
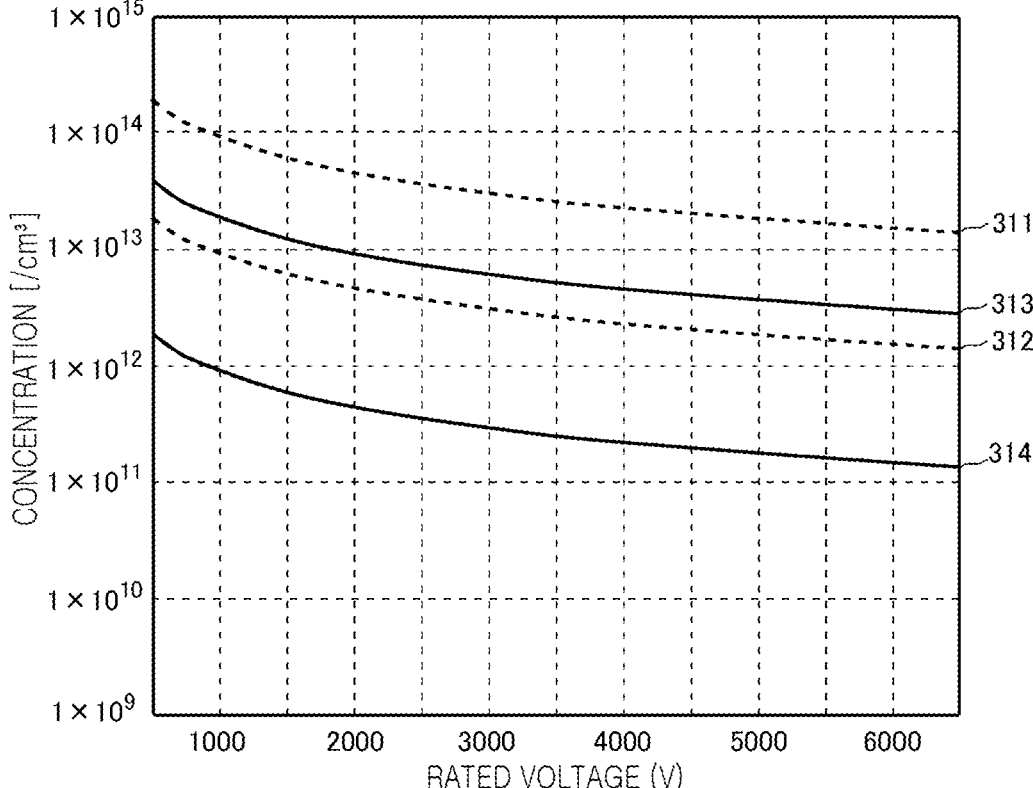
FIG. 15 is a diagram illustrating an example of a preferred range for the bulk donor concentration $N_{Bre}$ when ε' is in a range D (0.1 or more and to 0.2 or less).

FIG. 15 is a diagram illustrating an example of a preferred range for the bulk donor concentration $N_{Bre}$ when $\varepsilon'$ is in a range D (0.1 or more and 0.2 or less). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.2) of $\varepsilon'$. The lower limit 314 of the bulk donor concentration $N_{Bre}$ is a value obtained by multiplying the lower limit 312 of the donor concentration $N_{Fre}$ (/cm$^3$) by the lower limit value (0.1) of ε'. The upper limit 313 and the lower limit 314 of the bulk donor concentration $N_{Bre}$ are as follows.

Lower limit 314: $(9.20245 \times 10^{14})/x$

Upper limit 313: $(1.84049 \times 10^{16})/x$

Figure 16:
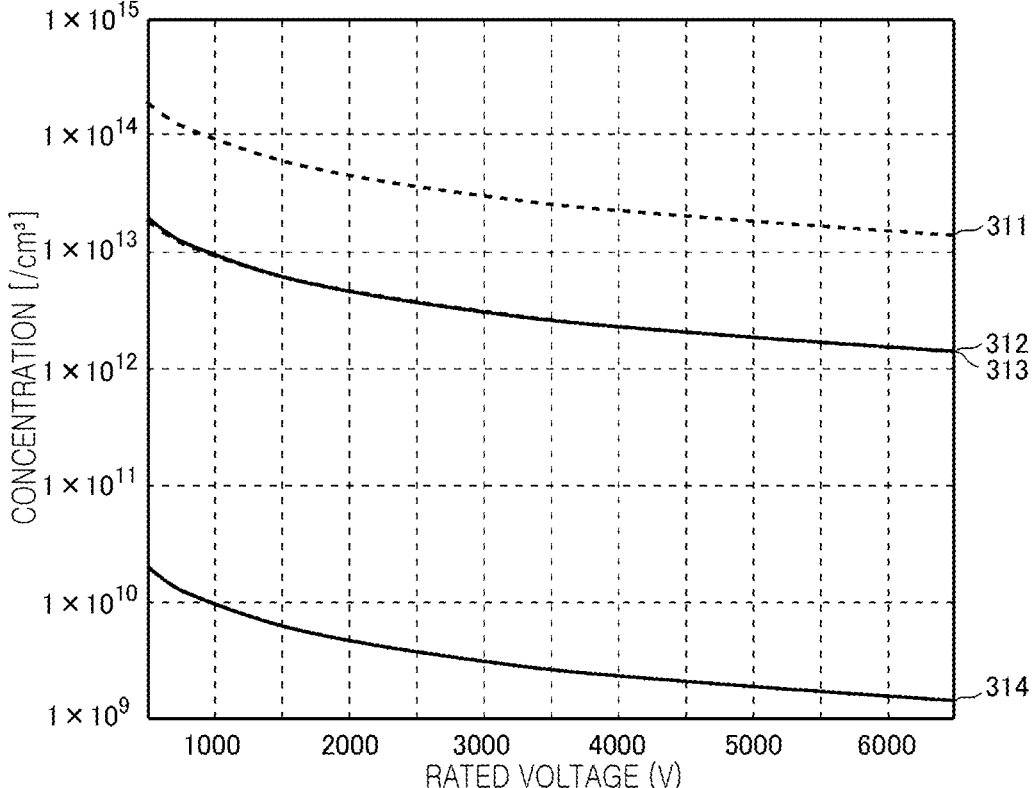
FIG. 16 is a diagram illustrating an example of a preferred range for the bulk donor concentration $N_{Bre}$ when ε' is in a range E (0.001 or more and 0.1 or less).

FIG. 16 is a diagram illustrating an example of a preferred range for the bulk donor concentration $N_{Bre}$ when ε' is in a range E (0.001 or more and 0.1 or less). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.1) of ε'. The lower limit 314 of the bulk donor concentration $N_{Bre}$ is a value obtained by multiplying the lower limit 312 of the donor concentration $N_{Fre}$ (/cm$^3$) by the lower limit value (0.001) of ε'. The upper limit 313 and the lower limit 314 of the bulk donor concentration $N_{Bre}$ are as follows.

Lower limit 314: $(9.20245 \times 10^{12})/x$

Upper limit 313: $(9.20245 \times 10^{15})/x$

Figure 17:
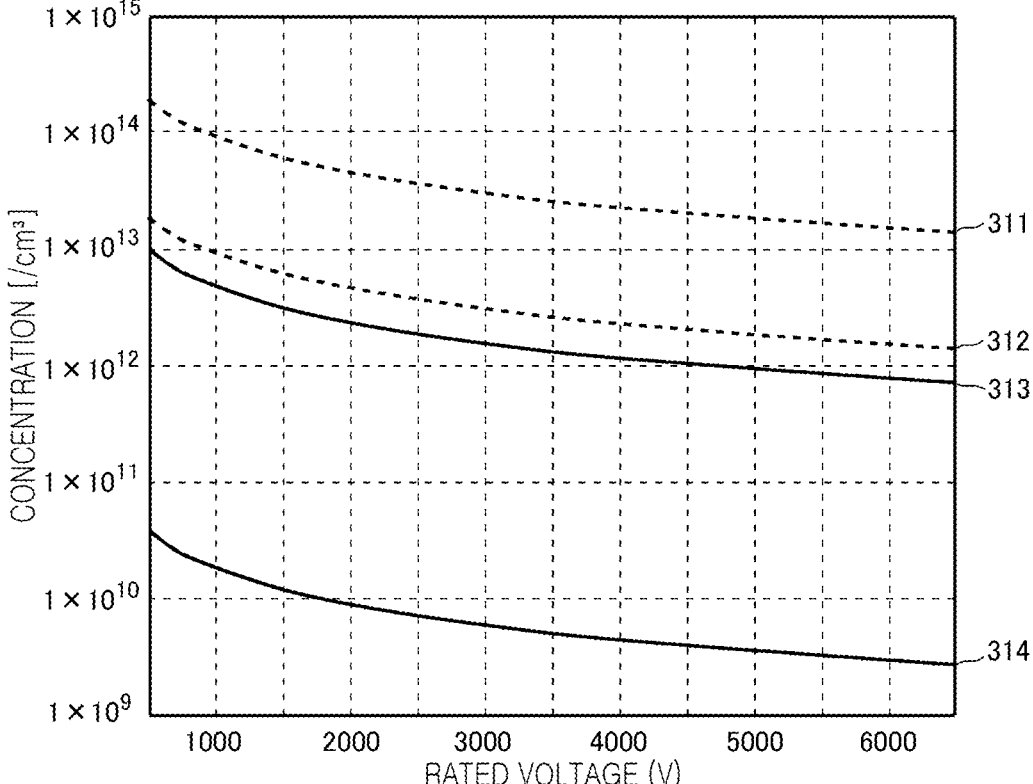
FIG. 17 is a diagram illustrating an example of a preferred range for the bulk donor concentration $N_{Bre}$ when ε' is in a range F (0.002 or more and 0.05 or less).

FIG. 17 is a diagram illustrating an example of a preferred range for the bulk donor concentration $N_{Bre}$ when ε' is in a range F (0.002 or more and 0.05 or less). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.05) of ε'. The lower limit 314 of the bulk donor concentration $N_{Bre}$ is a value obtained by multiplying the lower limit 312 of the donor concentration $N_{Fre}$ (/cm$^3$) by the lower limit value (0.002) of ε'. The upper limit 313 and the lower limit 314 of the bulk donor concentration $N_{Bre}$ are as follows.

Lower limit 314: $(1.84049 \times 10^{13})/x$

Upper limit 313: $(4.60123 \times 10^{15})/x$

Figure 18:
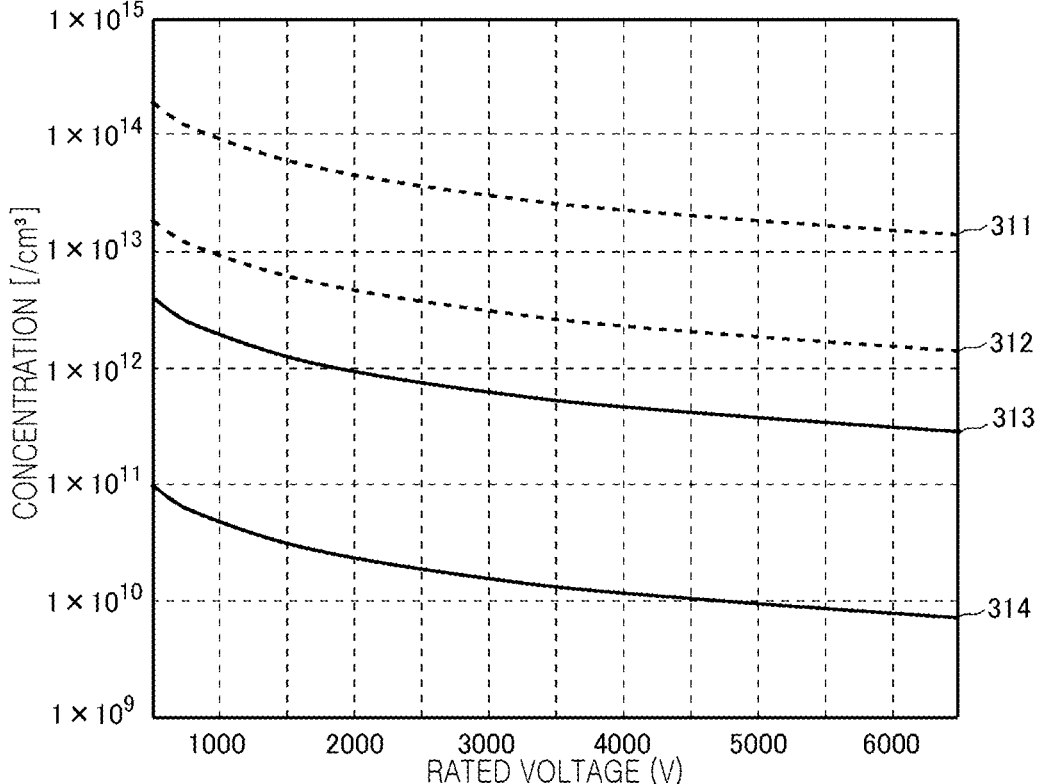
FIG. 18 is a diagram illustrating an example of a preferred range for the bulk donor concentration $N_{Bre}$ when ε' is in a range G (0.005 or more and 0.02 or less).

FIG. 18 is a diagram illustrating an example of a preferred range for the bulk donor concentration $N_{Bre}$ when ε' is in a range G (0.005 or more and 0.02 or less). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.02) of ε'. The lower limit 314 of the bulk donor concentration $N_{Bre}$ is a value obtained by multiplying the lower limit 312 of the donor concentration $N_{Fre}$ (/cm$^3$) by the lower limit value (0.005) of ε'. The upper limit 313 and the lower limit 314 of the bulk donor concentration $N_{Bre}$ are as follows.

Lower limit 314: $(4.60123 \times 10^{13})/x$

Upper limit 313: $(1.84049 \times 10^{15})/x$

Figure 19:
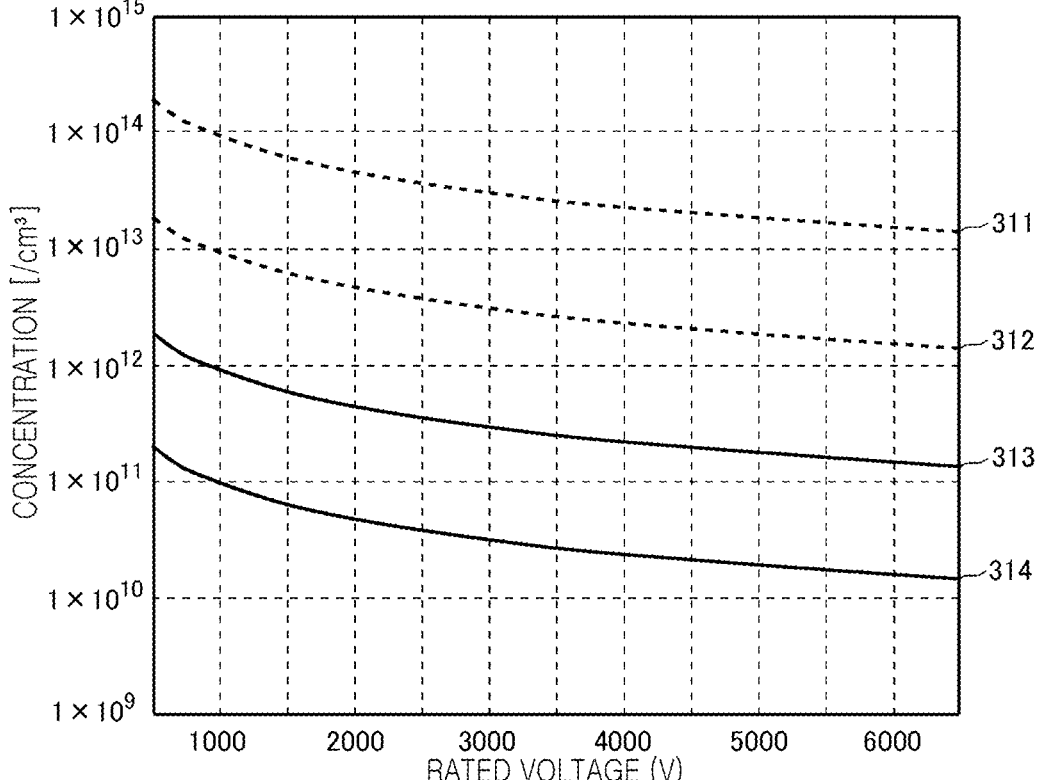
FIG. 19 is a diagram illustrating an example of a preferred range for the bulk donor concentration $N_{Bre}$ when ε' is in a range H (0.01±0.002).

FIG. 19 is a diagram illustrating an example of a preferred range for the bulk donor concentration $N_{Bre}$ when ε' is in a range H (0.01±0.002). The upper limit 311 and the lower limit 312 of the donor concentration $N_{Fre}$ (/cm$^3$) are the same as those in the example of FIG. 12. The upper limit 313 of the bulk donor concentration $N_{Bre}$ is a value obtained by multiplying the upper limit 311 of the donor concentration $N_{Fre}$ (/cm$^3$) by the upper limit value (0.01) of ε'. The lower limit 314 of the bulk donor concentration $N_{Bre}$ is a value obtained by multiplying the lower limit 312 of the donor concentration $N_{Fre}$ (/cm$^3$) by the lower limit value (0.01) of ε'. The upper limit 313 and the lower limit 314 of the bulk donor concentration $N_{Bre}$ are as follows.

Lower limit 314: $(9.20245 \times 10^{13})/x$

Upper limit 313: $(9.20245 \times 10^{14})/x$

Note that the upper limit 313 and the lower limit 314 in each range may have a width of ±20%.

As illustrated in FIG. 12 to FIG. 19, when the bulk donor concentration $N_{Bre}$ is set to a concentration between the upper limit 313 and the lower limit 314 in each example, γ indicating the variation in the final donor concentration $N_{Fre}$ can be suppressed within the allowable range. Note that the curve of the lower limit 314 may be smaller than the intrinsic carrier concentration. Here, the intrinsic carrier concentration is $1.45 \times 10^{10}$/cm$^3$ at room temperature (for example, 300 K). When the value of the curve of the lower limit 314 is smaller than the intrinsic carrier concentration, the lower limit 314 may be replaced with the intrinsic carrier concentration.

Figure 20:
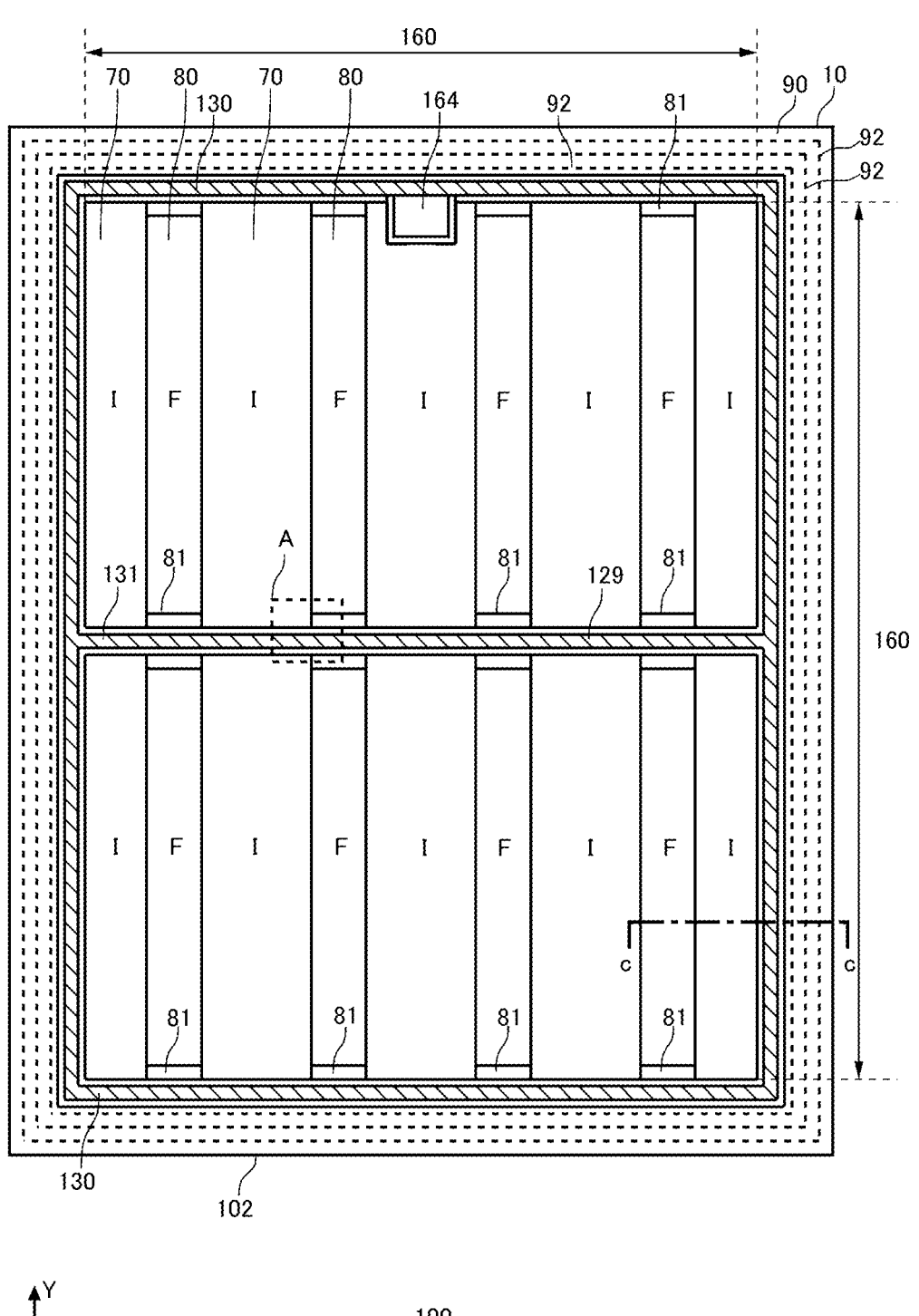
FIG. 20 illustrates an example of a top view of the semiconductor device 100.

FIG. 20 is an example of a top view of the semiconductor device 100. FIG. 20 illustrates a position where each member is projected on the upper surface of the semiconductor substrate 10. In FIG. 20, only some members of the semiconductor device 100 are illustrated, and the remaining members are omitted.

The semiconductor device 100 includes the semiconductor substrate 10 described with reference to FIG. 1 to FIG. 19. The semiconductor substrate 10 has end sides 102 in a top view. In the present specification, when simply referred to as a top view, it means viewing from the upper surface side of the semiconductor substrate 10. The semiconductor substrate 10 of the present example has two sets of end sides 102 facing each other in a top view. In FIG. 20, the X axis and the Y axis are parallel to one of the end sides 102. The Z axis is perpendicular to the upper surface of the semiconductor substrate 10.

The semiconductor substrate 10 is provided with an active portion 160. The active portion 160 is a region through which a main current flows in the depth direction between the upper surface and the lower surface of the semiconductor substrate 10 in a case where the semiconductor device 100 operates. An emitter electrode is provided above the active portion 160, but is omitted in FIG. 20.

In the active portion 160, there is provided at least one of a transistor portion 70 which includes a transistor device such as an IGBT, and a diode portion 80 which includes a diode device such as a freewheeling diode (FWD). In the example of FIG. 20, the transistor portion 70 and the diode portion 80 are disposed alternately along a predetermined arrangement direction (the X axis direction in the present example) in the upper surface of the semiconductor substrate 10. In another example, only one of the transistor portion 70 and the diode portion 80 may be provided in the active portion 160.

In FIG. 20, a region in which the transistor portion 70 is disposed is denoted by a symbol "I", and a region in which the diode portion 80 is disposed is denoted by a symbol "F". In the present specification, a direction perpendicular to the arrangement direction in a top view may be referred to as an extending direction (Y axis direction in FIG. 20). Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the lower surface of the semiconductor substrate 10. In the present specification, a region where the cathode region is provided is referred to as a diode portion 80. That is, the diode portion 80 is a region overlapping the cathode region in a top view. On the lower surface of the semiconductor substrate 10, a P+ type collector region may be provided in a region other than the cathode region. In the present specification, an extension region 81 obtained by extending the diode portion 80 in the Y axis direction to a gate runner to be described later may also be included in the diode portion 80. A collector region is provided in a lower surface of the extension region 81.

The transistor portion 70 has a P+ type collector region in a region in contact with the lower surface of the semiconductor substrate 10. In the transistor portion 70, a gate structure including an N type emitter region, a P type base region, a gate conductive portion, and a gate dielectric film is periodically disposed on the upper surface side of the semiconductor substrate 10.

The semiconductor device 100 may have one or more pads above the semiconductor substrate 10. The semiconductor device 100 of the present example includes a gate pad 164. The semiconductor device 100 may have pads such as an anode pad, a cathode pad, and a current detection pad. Each pad is disposed in the vicinity of the end side 102. The vicinity of the end side 102 refers to a region between the end side 102 and the emitter electrode in a top view. At the time of mounting the semiconductor device 100, each pad may be connected to an external circuit via wiring such as a wire.

A gate potential is applied to the gate pad 164. The gate pad 164 is electrically connected to the conductive portion of the gate trench portion of the active portion 160. The semiconductor device 100 includes a gate runner that connects the gate pad 164 and the gate trench portion. In FIG. 20, the gate runner is hatched with oblique lines.

The gate runner of the present example includes an outer peripheral gate runner 130 and an active-side gate runner 129. The outer peripheral gate runner 130 is disposed between the active portion 160 and the end side 102 of the semiconductor substrate 10 in a top view. The outer peripheral gate runner 130 of the present example surrounds the active portion 160 in a top view. A region surrounded by the outer peripheral gate runner 130 in a top view may be set as the active portion 160. The outer peripheral gate runner 130 is connected to the gate pad 164. The outer peripheral gate runner 130 is disposed above the semiconductor substrate 10. The outer peripheral gate runner 130 may be a metal wiring containing aluminum or the like.

The active-side gate runner 129 is provided in the active portion 160. With the provision of the active-side gate runner 129 in the active portion 160, it is possible to reduce a variation in wiring length from the gate pad 164 in each region of the semiconductor substrate 10.

The active-side gate runner 129 is connected to the gate trench portion of the active portion 160. The active-side gate runner 129 is disposed above the semiconductor substrate 10. The active-side gate runner 129 may be a wiring formed of a semiconductor such as polysilicon doped with impurities.

The active-side gate runner 129 may be connected to the outer peripheral gate runner 130. The active-side gate runner 129 of the present example is provided to extend in the X axis direction from one outer peripheral gate runner 130 to the other outer peripheral gate runner 130 so as to cross the active portion 160 at substantially the center in the Y axis direction. In a case where the active portion 160 is divided by the active-side gate runner 129, the transistor portion 70 and the diode portion 80 may be alternately disposed in the X axis direction in each divided region.

In addition, the semiconductor device 100 may be provided with a temperature sense portion (not illustrated) which is a PN junction diode formed of polysilicon or the like, and a current detection portion (not illustrated) which simulates the operation of the transistor portion provided in the active portion 160.

The semiconductor device 100 of the present example includes an edge termination structure portion 90 between the active portion 160 and the end side 102. The edge termination structure portion 90 of the present example is disposed between the outer peripheral gate runner 130 and the end side 102. The edge termination structure portion 90 reduces electric field strength on the upper surface side of the semiconductor substrate 10. The edge termination structure portion 90 includes a plurality of guard rings 92. The guard ring 92 is a P type region in contact with the upper surface of the semiconductor substrate 10. The guard ring 92 may surround the active portion 160 in a top view. The plurality of guard rings 92 are disposed at predetermined intervals between the outer peripheral gate runner 130 and the end side 102. The guard ring 92 disposed on the outer side may surround the guard ring 92 disposed on the inner side by one. The outer side refers to a side close to the end side 102, and the inner side refers to a side close to the outer peripheral gate runner 130. By providing the plurality of guard rings 92, the depletion layer on the upper surface side of the active portion 160 can be extended outward, and the breakdown voltage of the semiconductor device 100 can be improved. The edge termination structure portion 90 may further include at least one of a field plate, and a RESURF annularly provided surrounding the active portion 160.

Figure 21:
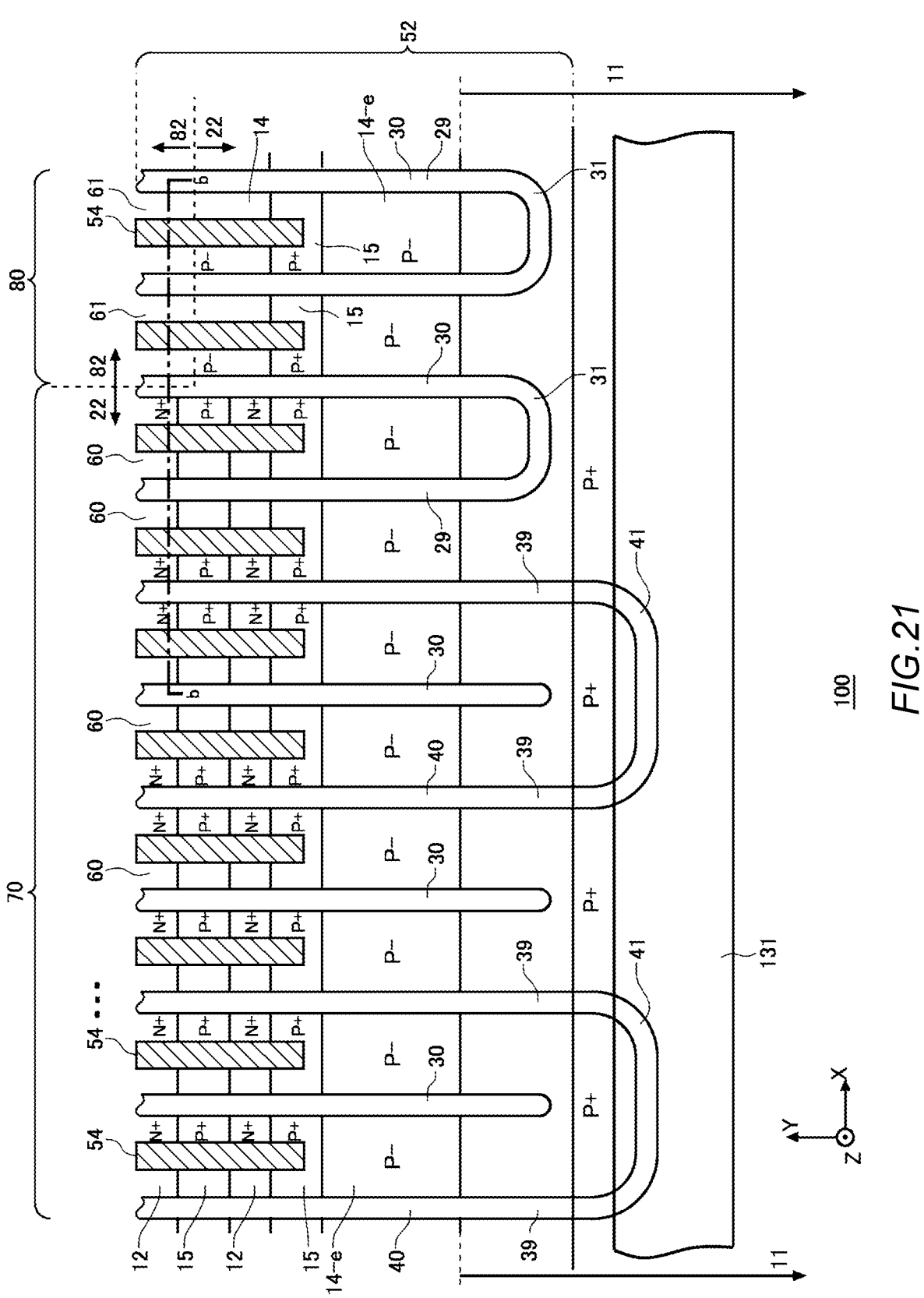
FIG. 21 is an enlarged view of a region A in FIG. 20.

FIG. 21 is an enlarged view of a region A in FIG. 20. The region A is a region including the transistor portion 70, the diode portion 80, and the active-side gate runner 129. The semiconductor device 100 of the present example includes a gate trench portion 40, a dummy trench portion 30, a well region 11, an emitter region 12, a base region 14, and a contact region 15 provided inside the upper surface side of the semiconductor substrate 10. The gate trench portion 40 and the dummy trench portion 30 are each an example of a trench portion. The semiconductor device 100 of the present example includes an emitter electrode 52 and the active-side gate runner 129 provided above the upper surface of the semiconductor substrate 10. The emitter electrode 52 and the active-side gate runner 129 are provided separately from each other.

An interlayer dielectric film is provided between the emitter electrode 52 and the active-side gate runner 129, and the upper surface of the semiconductor substrate 10, but is omitted in FIG. 21. In the interlayer dielectric film of the present example, a contact hole 54 is provided through the interlayer dielectric film. In FIG. 21, each contact hole 54 is hatched with oblique lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. The emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at the edge of the dummy trench portion 30 in the Y axis direction.

The active-side gate runner 129 is connected to the gate trench portion 40 through a contact hole provided in the interlayer dielectric film. The active-side gate runner 129 may be connected to the gate conductive portion of the gate trench portion 40 at an edge portion 41 of the gate trench portion 40 in the Y axis direction. The active-side gate runner 129 is not connected to the dummy conductive portion in the dummy trench portion 30.

The emitter electrode 52 is formed of a material containing metal. FIG. 21 illustrates a range in which the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in a lower layer of a region formed of aluminum or the like. Further, in the contact hole, there may be provided a plug formed by embedding tungsten or the like so as to be in contact with the barrier metal and aluminum or the like.

The well region 11 is provided to overlap with the active-side gate runner 129. The well region 11 is also provided to extend with a predetermined width in a range not overlapping with the active-side gate runner 129. The well region 11 of the present example is provided away from the end of the contact hole 54 in the Y axis direction toward the active-side gate runner 129. The well region 11 is a region of a second conductivity type having a higher doping concentration than the base region 14. The base region 14 of the present example is a P− type, and the well region 11 is a P+ type.

Each of the transistor portion 70 and the diode portion 80 includes a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 are provided along the arrangement direction. The diode portion 80 of the present example is not provided with the gate trench portion 40.

The gate trench portion 40 of the present example may have two straight portions 39 (portions of the trenches which are straight along the extending direction) extending along the extending direction perpendicular to the arrangement direction and the edge portion 41 connecting the two straight portions 39. The extending direction in FIG. 21 is the Y axis direction.

At least a part of the edge portion 41 is preferably provided in a curved shape in a top view. By connecting the end portions of the two straight portions 39 in the Y axis direction to each other by the edge portion 41, electric field strength at the end portion of the straight portion 39 can be reduced.

In the transistor portion 70, the dummy trench portion 30 is provided between the straight portions 39 of the gate trench portion 40. One dummy trench portion 30 may be provided between the straight portions 39, and a plurality of dummy trench portions 30 may be provided. The dummy trench portion 30 may have a linear shape extending in the extending direction, and may have a straight portion 29 and an edge portion 31 similar to the gate trench portion 40. The semiconductor device 100 illustrated in FIG. 21 includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. As a result, electric field strength at the bottom portion of each trench portion can be reduced.

A mesa portion is provided between the trench portions in the arrangement direction. The mesa portion refers to a region sandwiched between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of the present example is provided to extend in the extending direction (Y axis direction) along the trench in the upper surface of the semiconductor substrate 10. In the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In the base region 14 exposed to the upper surface of the semiconductor substrate 10 in the mesa portion, a region disposed closest to the active-side gate runner 129 is defined as a base region 14-e. In FIG. 21, the base region 14-e disposed at one end portion of each mesa portion in the extending direction is illustrated, but the base region 14-e is also disposed at the other end portion of each mesa portion. In each mesa portion, at least one of the emitter region 12 of the first conductivity type and the contact region 15 of the second conductivity type may be provided in a region sandwiched between the base regions 14-e in a top view. The emitter region 12 of the present example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion to the other trench portion in the X axis direction. As an example, the contact regions 15 and the emitter regions 12 of the mesa portion 60 are alternately disposed along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched between the emitter regions 12.

The emitter region 12 is not provided in the mesa portion 61 of the diode portion 80. The base region 14 and the contact region 15 may be provided in the upper surface of the mesa portion 61. The contact region 15 may be provided in contact with each of the base regions 14-e in a region sandwiched between the base regions 14-e in the upper surface of the mesa portion 61. The base region 14 may be provided in a region sandwiched between the contact regions 15 in the upper surface of the mesa portion 61. The base region 14 may be disposed in the entire region sandwiched between the contact regions 15.

A contact hole 54 is provided above each mesa portion. The contact hole 54 is disposed in a region sandwiched between the base regions 14-e. The contact hole 54 of the present example is provided above each region of the contact region 15, the base region 14, and the emitter region 12. The contact hole 54 is not provided in a region corresponding to the base region 14-e and the well region 11. The contact hole 54 may be disposed at the center in the arrangement direction (X axis direction) of the mesa portion 60.

In the diode portion 80, an N+ type cathode region 82 is provided in a region adjacent to the lower surface of the semiconductor substrate 10. In the lower surface of the semiconductor substrate 10, a P+ type collector region 22 may be provided in a region where the cathode region 82 is not provided. In FIG. 21, the boundary between the cathode region 82 and the collector region 22 is indicated by a dotted line.

The cathode region 82 is disposed away from the well region 11 in the Y axis direction. As a result, a distance between the P type region (well region 11) having a relatively high doping concentration and formed up to a deep position and the cathode region 82 is secured, and the breakdown voltage can be improved. The end portion of the cathode region 82 in the Y axis direction of the present example is disposed farther from the well region 11 than the end portion of the contact hole 54 in the Y axis direction. In another example, the end portion of the cathode region 82 in the Y axis direction may be disposed between the well region 11 and the contact hole 54.

Figure 22A:
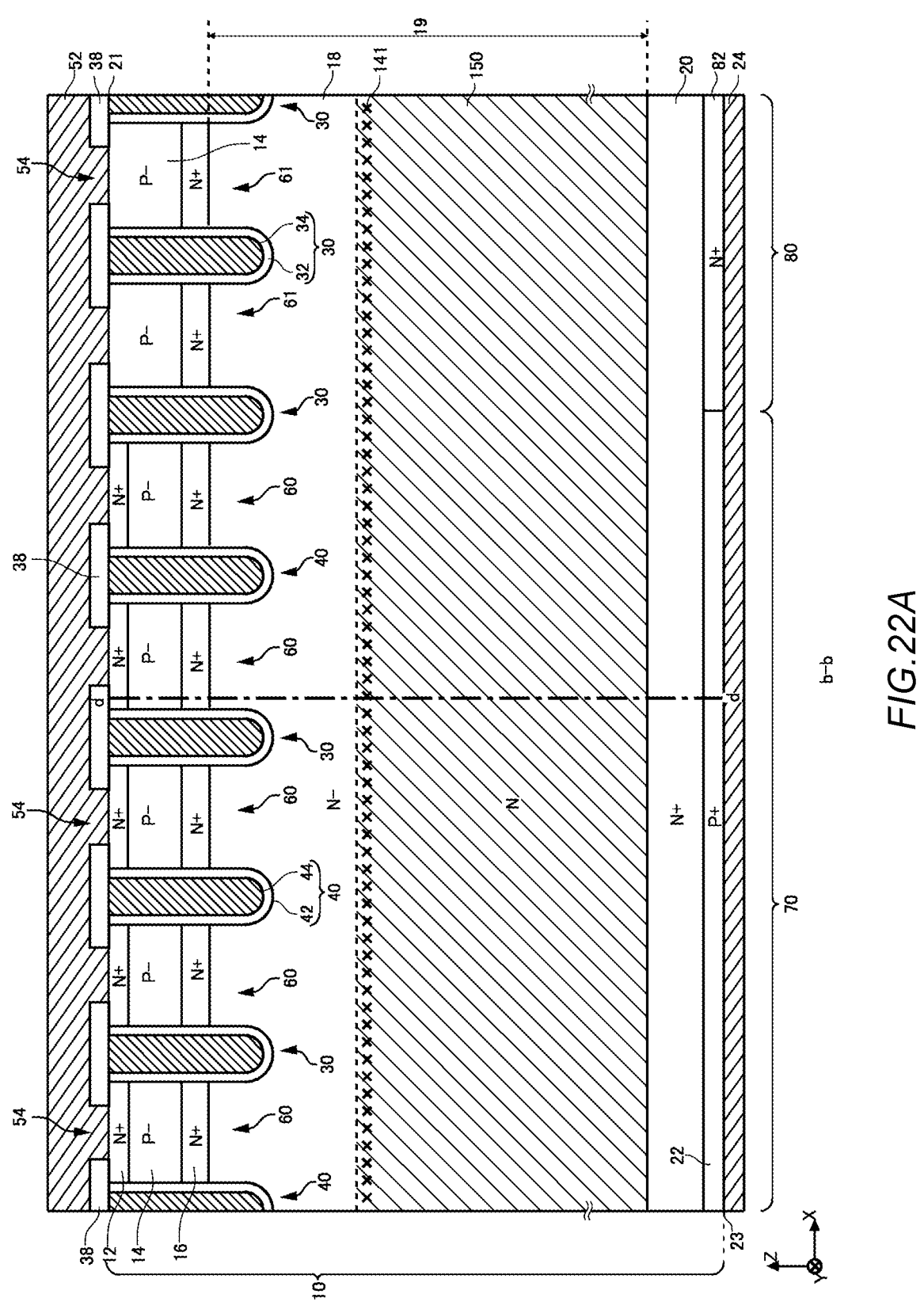
FIG. 22A is a diagram illustrating an example of a cross section b-b in FIG. 21.

FIG. 22A is a diagram illustrating an example of a cross section b-b in FIG. 21. The cross section b-b is an XZ plane passing through the emitter region 12 and the cathode region 82. The semiconductor device 100 of the present example includes the semiconductor substrate 10, an interlayer dielectric film 38, the emitter electrode 52, and a collector electrode 24 in the cross section. The interlayer dielectric film 38 is provided in the upper surface of the semiconductor substrate 10. The interlayer dielectric film 38 is a film including at least one of a dielectric film such as silicate glass to which an impurity such as boron or phosphorus is added, a thermal oxide film, and other dielectric films. The interlayer dielectric film 38 is provided with the contact hole 54 described in FIG. 21.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided in the lower surface 23 of the semiconductor substrate 10. The emitter electrode 52 and the collector electrode 24 are made of a metal material such as aluminum. In the present specification, a direction (Z axis direction) connecting the emitter electrode 52 and the collector electrode 24 is referred to as a depth direction.

The semiconductor substrate 10 has an N type drift region 19. The drift region 19 of the present example is an N type region from the lower end of the accumulation region 16 to the upper end of the buffer region 20. The drift region 19 of the present example has the high-concentration region 150 described in FIG. 1 to FIG. 19. In FIG. 22A, the high-concentration region 150 is hatched with oblique lines. The high-concentration region 150 may be provided in the transistor portion 70, may be provided in the diode portion 80, or may be provided in both the transistor portion 70 and the diode portion 80. The high-concentration region 150 is a region provided from the upper end of the buffer region 20 toward the upper surface 21. The impurity chemical concentration peak 141 (see FIG. 1 or the like) is disposed at the upper end portion of the high-concentration region 150.

The drift region 19 may have an N type bulk donor region 18. The bulk donor region 18 is a region where the doping concentration coincides with the donor concentration of the bulk donor. The bulk donor region 18 is a region disposed above the high-concentration region 150. The bulk donor region 18 in the present example is provided in each of the transistor portion 70 and the diode portion 80.

In the mesa portion 60 of the transistor portion 70, an N+ type emitter region 12 and a P− type base region 14 are provided in order from the upper surface 21 side of the semiconductor substrate 10. The bulk donor region 18 is provided below the base region 14. The mesa portion 60 may be provided with an N+ type accumulation region 16. The accumulation region 16 is disposed between the base region 14 and the bulk donor region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a doping concentration higher than that of the bulk donor region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is an N+ type region having a doping concentration higher than that of the drift region 19. The accumulation region 16 may have a doping concentration higher than that of the high-concentration region 150. By providing the high-concentration accumulation region 16 between the drift region 19 and the base region 14, the carrier injection-enhancement effect (IE effect) can be enhanced, and the ON voltage can be reduced. The accumulation region 16 may be provided so as to cover the entire lower surface of the base region 14 in each mesa portion 60.

The mesa portion 61 of the diode portion 80 is provided with a P− type base region 14 in contact with the upper surface 21 of the semiconductor substrate 10. The bulk donor region 18 is provided below the base region 14. In the mesa portion 61, the accumulation region 16 may be provided below the base region 14.

In each of the transistor portion 70 and the diode portion 80, an N+ type buffer region 20 is provided on the lower surface 23 side of the high-concentration region 150. The structure of the buffer region 20 is the same as that of the buffer region 20 described in FIG. 1 to FIG. 19. The buffer region 20 may function as a field stop layer that prevents a depletion layer spreading from the lower end of the base region 14 from reaching the P+ type collector region 22 and the N+ type cathode region 82.

In the transistor portion 70, the P+ type collector region 22 is provided below the buffer region 20. The collector region 22 is an example of the lower surface region 201 described in FIG. 1 to FIG. 19. The acceptor concentration of the collector region 22 is higher than the acceptor concentration of the base region 14. The collector region 22 may contain the same acceptor as the base region 14, and may contain a different acceptor. The acceptor of the collector region 22 is, for example, boron.

In the diode portion 80, the N+ type cathode region 82 is provided below the buffer region 20. The cathode region 82 is an example of the lower surface region 201 described in FIG. 1 to FIG. 19. The donor concentration of the cathode region 82 is higher than the donor concentration of the high-concentration region 150. The donor of the cathode region 82 is, for example, hydrogen or phosphorus. Elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 19. In the region where at least one of the emitter region 12, the contact region 15, and the accumulation region 16 is provided, each trench portion also penetrates these doping regions and reaches the bulk donor region 18. The trench portion penetrating the doping region is not limited to those manufactured in the order of forming the doping region and then forming the trench portion. The doping region formed between the trench portions after forming the trench portions is also included in a doping region in which the trench portion penetrates.

As described above, the transistor portion 70 is provided with the gate trench portion 40 and the dummy trench portion 30. The diode portion 80 is provided with the dummy trench portion 30 and is not provided with the gate trench portion 40. In the present example, the boundary between the diode portion 80 and the transistor portion 70 in the X axis direction is the boundary between the cathode region 82 and the collector region 22.

The gate trench portion 40 includes a gate trench, a gate dielectric film 42, and a gate conductive portion 44 provided in the upper surface 21 of the semiconductor substrate 10. The gate dielectric film 42 is provided to cover the inner wall of the gate trench. The gate dielectric film 42 may be formed by oxidizing or nitriding the semiconductor of the inner wall of the gate trench. The gate conductive portion 44 is provided on the inner side of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. If a predetermined gate voltage is applied to the gate conductive portion 44, a channel by an inversion layer of electrons is formed in a surface layer of the interface in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad (not illustrated) connected to an external circuit different from the gate pad, and control different from that of the gate conductive portion 44 may be performed. The dummy conductive portion 34 may be electrically connected to the emitter electrode 52. The dummy dielectric film 32 is provided to cover the inner wall of the dummy trench. The dummy conductive portion 34 is provided inside the dummy trench and is provided on the inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 on the upper surface 21 of the semiconductor substrate 10. Note that the bottom portions of the dummy trench portion 30 and the gate trench portion 40 may be a curved surface shape protruding downward (a curved shape in a cross section).

The semiconductor substrate 10 has the same distributions of the impurity chemical concentration $C_I$, the hydrogen chemical concentration $C_H$, and the doping concentration $D_d$ as in any of the examples described in FIG. 1 to FIG. 19. According to the semiconductor device 100 of the present example, by providing the high-concentration region 150, it is possible to suppress the variation in the doping concentration in the drift region 19.

Figure 22B:
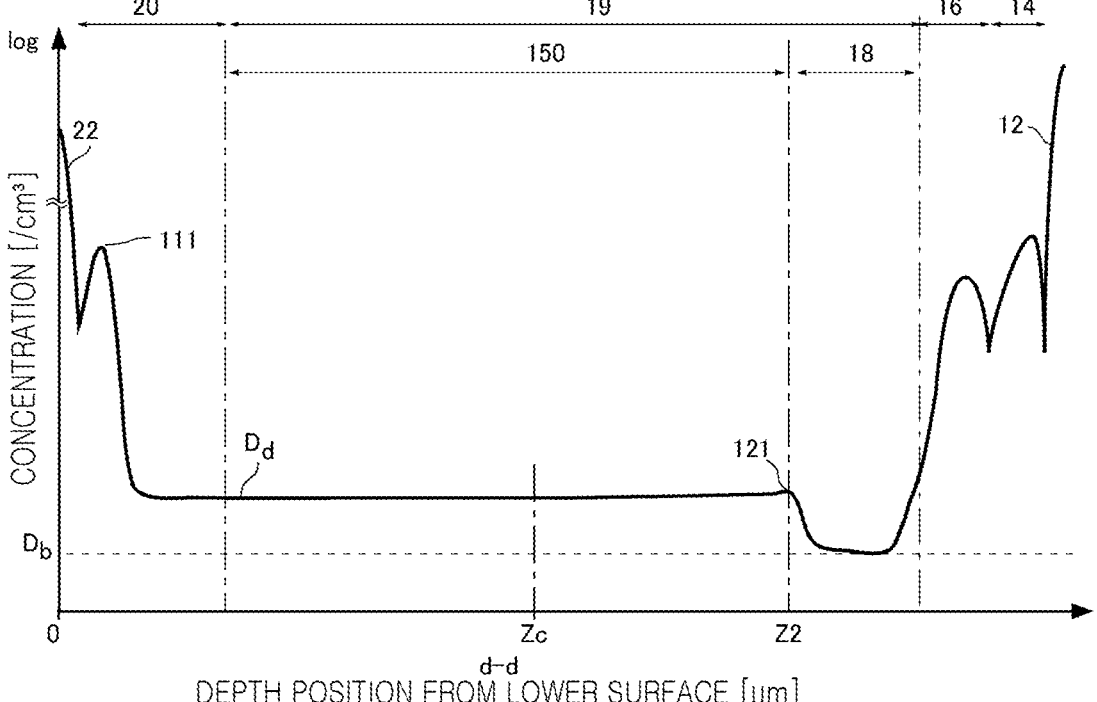
FIG. 22B is a diagram illustrating a distribution example of the doping concentration $D_d$ in line d-d of FIG. 22A.

FIG. 22B is a diagram illustrating an example of the distribution of the doping concentration $D_d$ in line d-d of FIG. 22A. The line d-d is a line parallel to the Z axis passing through the collector region 22 and the mesa portion 60. The distribution of the doping concentration $D_d$ in the present example is the same as the distribution of the doping concentration $D_d$ illustrate in FIG. 2 from the collector region 22 to the second doping concentration peak 121. The doping concentration $D_d$ of the present example has concentration peaks in each of the accumulation region 16, the base region 14, and the emitter region 12. The semiconductor substrate 10 of the present example includes the bulk donor region 18 between the accumulation region 16 and the second doping concentration peak 121. The bulk donor region 18 may be in contact with the accumulation region 16. That is, at the boundary between the bulk donor region 18 and the accumulation region 16, the doping concentration $D_d$ may be continuously increased from the bulk donor concentration $D_b$ to the local maximum of the concentration peak of the accumulation region 16.

Figure 23:
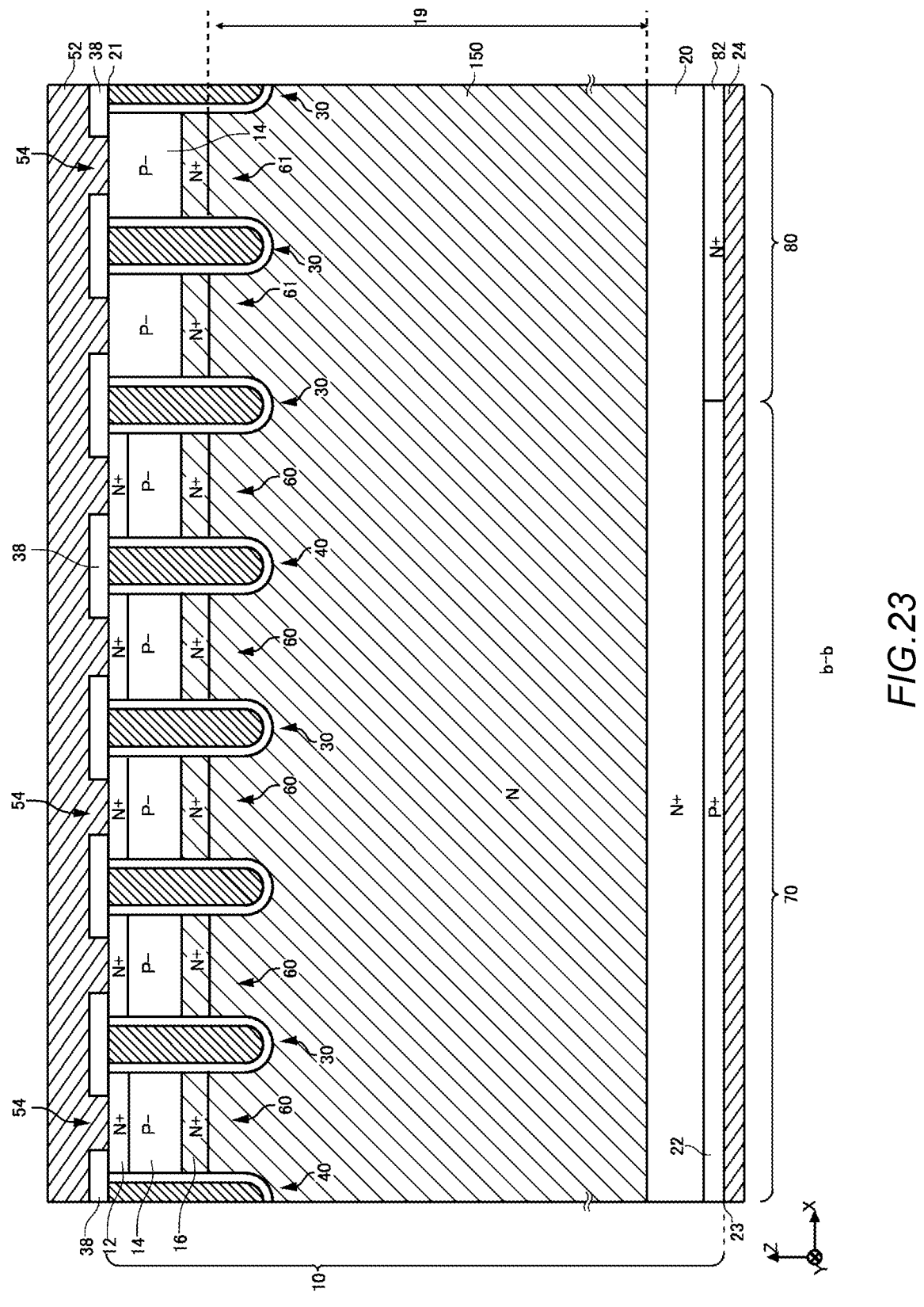
FIG. 23 is a diagram illustrating another example of the cross section b-b in FIG. 21.

FIG. 23 is a diagram illustrating another example of the cross section b-b in FIG. 21. The semiconductor device 100 of the present example differs from the example of FIG. 22A in that the high-concentration region 150 is provided over the entire drift region 19. Other structures may be the same as in the example of FIG. 22A.

The high-concentration region 150 of the present example may be provided from the upper end of the buffer region 20 to a position in contact with the accumulation region 16. The high-concentration region 150 may be formed up to the inside of the accumulation region 16. In this case, the second doping concentration peak 121 may be disposed in the accumulation region 16. In a case where the semiconductor device 100 does not include the accumulation region 16, the high-concentration region 150 may be provided up to a position in contact with the base region 14. According to the present example, the variation in the doping concentration can be suppressed over the entire drift region 19.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 11: well region; 12: emitter region; 14: base region; 15: contact region; 16: accumulation region; 18: bulk donor region; 19: drift region; 20: buffer region; 21: upper surface; 22: collector region; 23: lower surface; 24: collector electrode; 29: straight portion; 30: dummy trench portion; 31: edge portion; 32: dummy dielectric film; 34: dummy conductive portion; 38: interlayer dielectric film; 39: straight portion; 40: gate trench portion; 41: edge portion; 42: gate dielectric film; 44: gate conductive portion; 52: emitter electrode; 54: contact hole; 60, 61: mesa portion; 70: transistor portion; 80: diode portion; 81: extension region; 82: cathode region; 90: edge termination structure portion; 92: guard ring; 100: semiconductor device; 102: end side; 106: passed-through region; 111: first doping concentration peak; 112: lower tail; 113: upper tail; 114: gradient; 117: doping concentration peak; 119: chemical concentration peak; 121: second doping concentration peak; 122: lower tail; 123: upper tail; 124: gradient; 125: gradient; 129: active-side gate runner; 130: outer peripheral gate runner; 131: hydrogen chemical concentration peak; 132: lower tail; 133: upper tail; 134: gradient; 137: hydrogen chemical concentration peak; 141: impurity chemical concentration peak; 142: lower tail; 143: upper tail; 144: gradient; 145: gradient; 150: high-concentration region; 160: active portion; 164: gate pad; 181: low concentration region; 201: lower surface region; 211: first defect density peak; 212: second defect density peak; 213: defect density peak; 214: defect density peak; 311: upper limit; 312: lower limit; 313: upper limit; 314: lower limit

What is claimed is:

1. A semiconductor device comprising:
a semiconductor substrate having an upper surface and a lower surface, and containing a bulk donor;
a buffer region of a first conductivity type which is disposed on the lower surface side of the semiconductor substrate and contains a hydrogen donor, and in which a doping concentration distribution of the semiconductor substrate in a depth direction has a first doping concentration peak with a first hydrogen chemical concentration peak;
an impurity chemical concentration peak is disposed on an upper surface side of the semiconductor substrate, wherein a doping concentration at a position of the impurity chemical concentration peak is less than an impurity chemical concentration of the impurity chemical concentration peak;
a high-concentration region of the first conductivity type including the impurity chemical concentration peak that is located in the upper surface side of the semiconductor substrate in the high-concentration region which is in contact with the first doping concentration peak of the buffer region contains a hydrogen donor, and has a donor concentration higher than a bulk donor concentration; and
a lower surface region of the first conductivity type or a second conductivity type which is disposed between the buffer region and the lower surface of the semiconductor substrate, and has a doping concentration higher than the high-concentration region, wherein
at least in a uniform region, a hydrogen chemical concentration monotonically decreases from the buffer region at least up to the impurity chemical concentration peak,
a doping concentration distribution of the uniform region is within a range in which a value of the doping concentration distribution is within ±10% of an average concentration of the doping concentration distribution in a first range in the uniform region, and
when a length of the high-concentration region in the depth direction is set to $Z_L$ and a center between the shallowest doping concentration peak and the impurity chemical concentration peak in the depth direction is set to $Z_{12C}$, the first range is a section with a length of $0.5Z_L$ including the center $Z_{12C}$, the length of the first range is set between two points separated by $0.25Z_L$ from the center $Z_{12C}$ between $Z_1$ and $Z_2$, toward the first depth position $Z_1$ side and the second depth position $Z_2$ side, and
in the high-concentration region, a hydrogen chemical concentration monotonically decreases from the buffer region beyond the impurity chemical concentration peak toward the upper surface.

2. The semiconductor device according to claim 1, wherein
the first doping concentration peak of the buffer region is a concentration peak of the hydrogen donor.

3. The semiconductor device according to claim 1, wherein
the first doping concentration peak of the buffer region is a concentration peak of an N type dopant other than the hydrogen donor.

4. The semiconductor device according to claim 1, wherein
the impurity chemical concentration decreases more steeply in an upper tail, in which an impurity chemical concentration decreases from a local maximum of the impurity chemical concentration peak toward the upper surface side, than in a lower tail in which the impurity chemical concentration decreases from the local maximum of the impurity chemical concentration peak toward the lower surface side.

5. The semiconductor device according to claim 4, further comprising:

a hydrogen chemical concentration peak which is disposed at a same depth position as the first doping concentration peak of the buffer region; and a second doping concentration peak which is disposed at a same depth position as the impurity chemical concentration peak, wherein the impurity chemical concentration peak is a chemical concentration peak of hydrogen, each concentration peak has a lower tail in which a concentration increases from the lower surface of the semiconductor substrate toward the upper surface, and a value obtained by normalizing a gradient of the lower tail of the second doping concentration peak with a gradient of the lower tail of the impurity chemical concentration peak is smaller than a value obtained by normalizing a gradient of the lower tail of the first doping concentration peak with a gradient of the lower tail of the hydrogen chemical concentration peak.

6. The semiconductor device according to claim 1, wherein the high-concentration region has a length of 50% or more of a thickness of the semiconductor substrate in the depth direction of the semiconductor substrate.

7. The semiconductor device according to claim 2, wherein the high-concentration region has a length of 50% or more of a thickness of the semiconductor substrate in the depth direction of the semiconductor substrate.

8. The semiconductor device according to claim 1, wherein the high-concentration region has a length of 70 μm or more in the depth direction of the semiconductor substrate.

9. The semiconductor device according to claim 1, wherein the donor concentration of the high-concentration region is two times the bulk donor concentration.

10. The semiconductor device according to claim 1, wherein the donor concentration of the high-concentration region is five times or more of the bulk donor concentration.

11. The semiconductor device according to claim 1, wherein when a rated voltage of the semiconductor device is x(V), the bulk donor concentration (atoms/cm$^3$) is ($9.20245 \times 10^{12}$)/x or more and ($4.60123 \times 10^{16}$)/x or less.

12. The semiconductor device according to claim 11, wherein the bulk donor concentration (atoms/cm$^3$) is ($9.20245 \times 10^{14}$)/x or more and ($1.84049 \times 10^{16}$)/x or less.

13. The semiconductor device according to claim 11, wherein a donor concentration (/cm$^3$) at a center of the semiconductor substrate in the depth direction is ($9.20245 \times 10^{15}$)/x or more and ($9.20245 \times 10^{16}$)/x or less.

14. The semiconductor device according to claim 1, further comprising:

an accumulation region which is disposed on the upper surface side of the semiconductor substrate, and has a doping concentration higher than the high-concentration region, wherein the high-concentration region is provided up to a position in contact with the accumulation region.

15. The semiconductor device according to claim 1, wherein:

the high-concentration region includes, between the buffer region and the impurity chemical concentration peak, the uniform region in which a doping concentration is substantially uniform.

16. The semiconductor device according to claim 1, wherein:

the doping concentration distribution increases from the uniform region toward the impurity chemical concentration peak while the hydrogen chemical concentration decreases.

17. The semiconductor device according to claim 1, wherein a drift region of the first conductivity-type is disposed between the buffer region and the upper surface, the drift region contains the high concentration region, in which a doping concentration of the drift region is a same as the bulk donor concentration.

* * * * *